(12) United States Patent
Silverbrook

(10) Patent No.: US 6,451,216 B1
(45) Date of Patent: *Sep. 17, 2002

(54) METHOD OF MANUFACTURE OF A THERMAL ACTUATED INK JET PRINTER

(75) Inventor: Kia Silverbrook, Sydney (AU)

(73) Assignee: Silverbrook Research Pty Ltd, Balmain (AU)

(*) Notice: Subject to any disclaimer, the term of this patent is extended or adjusted under 35 U.S.C. 154(b) by 0 days.

This patent is subject to a terminal disclaimer.

(21) Appl. No.: 09/113,117

(22) Filed: Jul. 10, 1998

(30) Foreign Application Priority Data

Jul. 15, 1997 (AU) .............................. PO7948
Jul. 15, 1997 (AU) .............................. PO7991

(51) Int. Cl.$^7$ .................................. B41J 2/16
(52) U.S. Cl. ........................................ 216/27
(58) Field of Search ................. 216/27; 438/21; 347/54, 59

(56) References Cited

U.S. PATENT DOCUMENTS

| | | | |
|---|---|---|---|
| 4,008,111 A | * 2/1977 | Rutz | ........................ 156/656 |
| 5,565,113 A | * 10/1996 | Hadimioglu et al. | ........... 216/2 |
| 5,892,524 A | * 4/1999 | Silverbrook | ................... 347/15 |
| 5,912,684 A | * 6/1999 | Fujii et al. | ....................... 347/54 |
| 6,258,285 B1 | * 7/2001 | Silverbrook | .................. 216/27 |
| 6,274,056 B1 | * 8/2001 | Silverbrook | .................. 216/27 |

FOREIGN PATENT DOCUMENTS

JP      3-240547 A   * 10/1991

* cited by examiner

*Primary Examiner*—Anita Alanko

(57) ABSTRACT

A method of manufacturing an ink jet printhead that includes etching a plurality of ink chambers in a semiconductor wafer that includes electrical circuitry. A first and second expansion layer and a conductive material layer between the first and second expansion layers are deposited on to the wafer and etched. The expansion layers are formed to be positioned over the ink chambers. Furthermore, the expansion layers are provided of a material that facilies displacement of the expansion layers upon heating thereof by the conductive material layer. The method includes the step of forming the expansive layers and conductive material layer into shutters for each ink chamber.

7 Claims, 11 Drawing Sheets

METHOD OF MANUFACTURE OF A THERMAL ACTUATED INK JET PRINTER

CROSS REFERENCES TO RELATED APPLICATIONS

The following Australian provisional patent applications are hereby incorporated by cross-reference. For the purposes of location and identification, US patent applications identified by their US patent application serial numbers (USSN) are listed alongside the Australian applications from which the US patent applications claim the right of priority.

| CROSS-REFERENCED AUSTRALIAN PROVISIONAL PATENT APPLICATION NO. | US PATENT/PATENT APPLICATION (CLAIMING RIGHT OF PRIORITY FROM AUSTRALIAN PROVISIONAL APPLICATION) | DOCKET NO. |
| --- | --- | --- |
| PO7991 | 09/113,060 | ART01 |
| PO7988 | 09/113,070 | ART02 |
| PO7993 | 09/113,073 | ART03 |
| PO9395 | 09/112,748 | ART04 |
| PO8017 | 09/112,747 | ART06 |
| PO8014 | 09/112,776, U.S. Pat. No. 6,227,648 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 6,196,541 | ART13 |
| PO7997 | 6,195,150 | ART15 |
| PO7979 | 09/113,053, U.S. Pat. No. 6,362,868 | ART16 |
| PO8015 | 09/112,738 | ART17 |
| PO7978 | 09/113,067 | ART18 |
| PO7982 | 09/113,063 | ART19 |
| PO7989 | 09/113,069, U.S. Pat. No. 6,362,869 | ART20 |
| PO8019 | 09/112,744 | ART21 |
| PO7980 | 09/113,058, U.S. Pat. No. 6,356,715 | ART22 |
| PO8018 | 09/112,777 | ART24 |
| PO7938 | 09/113,224 | ART25 |
| PO8016 | 09/112,804, U.S. Pat. No. 6,366,693 | ART26 |
| PO8024 | 09/112,805, U.S. Pat. No. 6,329,990 | ART27 |
| PO7940 | 09/113,072 | ART28 |
| PO7939 | 09/112,785 | ART29 |
| PO8501 | 6,137,500 | ART30 |
| PO8500 | 09/112,796 | ART31 |
| PO7987 | 09/113,071 | ART32 |
| PO8022 | 09/112,824, U.S. Pat. No. 6,398,328 | ART33 |
| PO8497 | 09/113,090 | ART34 |
| PO8020 | 09/112,823 | ART38 |
| PO8023 | 09/113,222 | ART39 |
| PO8504 | 09/112,786 | ART42 |
| PO8000 | 09/113,051, U.S. Pat. No. 6,415,054 | ART43 |
| PO7977 | 09/112,782 | ART44 |
| PO7934 | 09/113,056 | ART45 |
| PO7990 | 09/113,059 | ART46 |
| PO8499 | 09/113,091 | ART47 |
| PO8502 | 09/112,753, U.S. Pat. No. 6,381,361 | ART48 |
| PO7981 | 09/113,055, U.S. Pat. No. 6,317,192 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758, U.S. Pat. No. 6,357,135 | ART57 |
| PO9396 | 09/113,107 | ART58 |
| PO9397 | 09/112,829, U.S. Pat. No. 6,271,931 | ART59 |
| PO9398 | 09/112,792, U.S. Pat. No. 6,353,772 | ART60 |
| PO9399 | 6,106,147 | ART61 |
| PO9400 | 09/112,790 | ART62 |
| PO9401 | 09/112,789, U.S. Pat. No. 6,304,291 | ART63 |
| PO9402 | 09/112,788 | ART64 |
| PO9403 | 09/112,795, U.S. Pat. No. 6,305,770 | ART65 |
| PO9405 | 09/112,749, U.S. Pat. No. 6,289,262 | ART66 |
| PP0959 | 09/112,784, U.S. Pat. No. 6,315,200 | ART68 |
| PP1397 | 6,217,165 | ART69 |
| PP2370 | 09/112,781 | DOT01 |
| PP2371 | 09/113,052 | DOT02 |
| PO8003 | 09/112,834, U.S. Pat. No. 6,350,023 | Fluid01 |
| PO8005 | 09/113,103, U.S. Pat. No. 6,318,849 | Fluid02 |
| PO9404 | 09/113,101 | Fluid03 |
| PO8066 | 6,227,652 | IJ01 |
| PO8072 | 6,213,588 | IJ02 |
| PO8040 | 6,213,589 | IJ03 |
| PO8071 | 6,231,163 | IJ04 |
| PO8047 | 09/113,097, U.S. Pat. No. 6,247,795 | IJ05 |
| PO8035 | 09/113,099, U.S. Pat. No. 6,394,581 | IJ06 |
| PO8044 | 09/113,084, U.S. Pat. No. 6,244,691 | IJ07 |
| PO8063 | 09/113,066, U.S. Pat. No. 6,257,704 | IJ08 |
| PO8057 | 09/112,778 | IJ09 |
| PO8056 | 6,220,694 | IJ10 |
| PO8069 | 09/113,077, U.S. Pat. No. 6,257,705 | IJ11 |
| PO8049 | 09/113,061, U.S. Pat. No. 6,247,794 | IJ12 |
| PO8036 | 6,234,610 | IJ13 |
| PO8048 | 09/112,816, U.S. Pat. No. 6,247,793 | IJ14 |
| PO8070 | 09/112,772, U.S. Pat. No. 6,264,306 | IJ15 |
| PO8067 | 09/112,819, U.S. Pat. No. 6,241,342 | IJ16 |
| PO8001 | 09/112,815, U.S. Pat. No. 6,247,792 | IJ17 |
| PO8038 | 09/113,096, U.S. Pat. No. 6,264,307 | IJ18 |
| PO8033 | 09/113,068, U.S. Pat. No. 6,254,220 | IJ19 |
| PO8002 | 6,234,611 | IJ20 |
| PO8068 | 09/112,808, U.S. Pat. No. 6,302,528 | IJ21 |
| PO8062 | 09/112,809, U.S. Pat. No. 6,283,582 | IJ22 |
| PO8034 | 09/112,780, U.S. Pat. No. 6,239,821 | IJ23 |
| PO8039 | 09/113,083, U.S. Pat. No. 6,338,547 | IJ24 |
| PO8041 | 09/113,121, U.S. Pat. No. 6,247,796 | IJ25 |
| PO8004 | 09/113,122 | IJ26 |
| PO8037 | 09/112,793, U.S. Pat. No. 6,390,603 | IJ27 |

-continued

| CROSS-REFERENCED AUSTRALIAN PROVISIONAL PATENT APPLICATION NO. | US PATENT/PATENT APPLICATION (CLAIMING RIGHT OF PRIORITY FROM AUSTRALIAN PROVISIONAL APPLICATION) | DOCKET NO. |
|---|---|---|
| PO8043 | 09/112,794, U.S. Pat. No. 6,362,843 | IJ28 |
| PO8042 | 09/113,128, U.S. Pat. No. 6,293,653 | IJ29 |
| PO8064 | 09/113,127, U.S. Pat. No. 6,312,107 | IJ30 |
| PO9389 | 6,227,653 | IJ31 |
| PO9391 | 6,234,609 | IJ32 |
| PP0888 | 09/112,754, U.S. Pat. No. 6,238,040 | IJ33 |
| PP0891 | 6,188,415 | IJ34 |
| PP0890 | 6,227,654 | IJ35 |
| PP0873 | 6,209,989 | IJ36 |
| PP0993 | 09/112,814, U.S. Pat. No. 6,247,791 | IJ37 |
| PP0890 | 09/112,814, U.S. Pat. No. 6,336,710 | IJ38 |
| PP1398 | 6,217,153 | IJ39 |
| PP2592 | 09/112,767 | IJ40 |
| PP2593 | 09/112,768, U.S. Pat. No. 6,243,113 | IJ41 |
| PP3991 | 09/112,807, U.S. Pat. No. 6,283,581 | IJ42 |
| PP3987 | 09/112,806, U.S. Pat. No. 6,247,790 | IJ43 |
| PP3985 | 09/112,820, U.S. Pat. No. 6,260,953 | IJ44 |
| PP3983 | U.S. Pat. No. 6,267,469 | |
| PO7935 | 6,224,780 | IJM01 |
| PO7936 | 6,235,212 | IJM02 |
| PO7937 | 09/112,826, U.S. Pat. No. 6,280,643 | IJM03 |
| PO8061 | 09/112,827, U.S. Pat. No. 6,284,147 | IJM04 |
| PO8054 | 6,214,244 | IJM05 |
| PO8065 | 6,071,750 | IJM06 |
| PO8055 | 09/113,108, U.S. Pat. No. 6,267,905 | IJM07 |
| PO8053 | 09/113,109, U.S. Pat. No. 6,251,298 | IJM08 |
| PO8078 | 09/113,123, U.S. Pat. No. 6,258,285 | IJM09 |
| PO7933 | 6,225,138 | IJM10 |
| PO7950 | 09/113,115, U.S. Pat. No. 6,241,904 | IJM11 |
| PO7949 | 09/113,129, U.S. Pat. No. 6,299,786 | IJM12 |
| PO8060 | 09/113,124 | IJM13 |
| PO8059 | 6,231,773 | IJM14 |
| PO8073 | 6,190,931 | IJM15 |
| PO8076 | 09/113,119, U.S. Pat. No. 6,248,249 | IJM16 |
| PO8075 | 09/113,120, U.S. Pat. No. 6,290,862 | IJM17 |
| PO8079 | 09/113,221, U.S. Pat. No. 6,241,906 | IJM18 |
| PO8050 | 09/113,116 | IJM19 |
| PO8052 | 09/113,118, U.S. Pat. No. 6,241,905 | IJM20 |
| PO7948 | 09/113,117 | IJM21 |
| PO7951 | 6,231,772 | IJM22 |
| PO8074 | 09/113,130, U.S. Pat. No. 6,274,056 | IJM23 |
| PO7941 | 09/113,110, U.S. Pat. No. 6,290,861 | IJM24 |
| PO8077 | 09/113,112, U.S. Pat. No. 6,248,248 | IJM25 |
| PO8058 | 09/113,087, U.S. Pat. No. 6,306,671 | IJM26 |
| PO8051 | 09/113,074, | IJM27 |

-continued

| CROSS-REFERENCED AUSTRALIAN PROVISIONAL PATENT APPLICATION NO. | US PATENT/PATENT APPLICATION (CLAIMING RIGHT OF PRIORITY FROM AUSTRALIAN PROVISIONAL APPLICATION) | DOCKET NO. |
|---|---|---|
| | U.S. Pat. No. 6,331,258 | |
| PO8045 | 6,110,754 | IJM28 |
| PO7952 | 09/113,088, U.S. Pat. No. 6,294,101 | IJM29 |
| PO8046 | 09/112,771 | IJM30 |
| PO9390 | 09/112,769, U.S. Pat. No. 6,264,849 | IJM31 |
| PO9392 | 09/112,770, U.S. Pat. No. 6,254,793 | IJM32 |
| PP0889 | 6,235,211 | IJM35 |
| PP0887 | 09/112,801 | IJM36 |
| PP0882 | 09/112,800, U.S. Pat. No. 6,264,850 | IJM37 |
| PP0874 | 09/112,799, U.S. Pat. No. 6,258,284 | IJM38 |
| PP1396 | 09/113,098, U.S. Pat. No. 6,312,615 | IJM39 |
| PP3989 | 09/112,833, U.S. Pat. No. 6,228,668 | IJM40 |
| PP2591 | 6,180,427 | IJM41 |
| PP3990 | 6,171,875 | IJM42 |
| PP3986 | 09/112,830, U.S. Pat. No. 6,267,904 | IJM43 |
| PP3984 | 09/112,836, U.S. Pat. No. 6,245,247 | IJM44 |
| PP3982 | 09/112,835, U.S. Pat. No. 6,315,914 | IJM45 |
| PP0895 | 6,231,148 | IR01 |
| PP0870 | 09/113,106 | IR02 |
| PP0869 | 09/113,105, U.S. Pat. No. 6,293,658 | IR04 |
| PP0887 | 09/113,104 | IR05 |
| PP0885 | 09/112,810, U.S. Pat. No. 6,238,033 | IR06 |
| PP0884 | 09/112,766, U.S. Pat. No. 6,312,070 | IR10 |
| PP0886 | 09/113,085, U.S. Pat. No. 6,238,111 | IR12 |
| PP0871 | 09/113,086 | IR13 |
| PP0876 | 09/113,094 | IR14 |
| PP0877 | 09/112,760, U.S. Pat. No. 6,378,970 | IR16 |
| PP0878 | 6,196,739 | IR17 |
| PP0879 | 09/112,774 | IR18 |
| PP0883 | 09/112,775, U.S. Pat. No. 6,270,182 | IR19 |
| PP0880 | 6,152,619 | IR20 |
| PP0881 | 09/113,092 | IR21 |
| PO8006 | 6,087,638 | MEMS02 |
| PO8007 | 09/113,093, U.S. Pat. No. 6,340,222 | MEMS03 |
| PO8008 | 09/113,062 | MEMS04 |
| PO8010 | 6,041,600 | MEMS05 |
| PO8011 | 09/113,082, U.S. Pat. No. 6,299,300 | MEMS06 |
| PO7947 | 6,067,797 | MEMS07 |
| PO7944 | 09/113,080, U.S. Pat. No. 6,286,935 | MEMS09 |
| PO7946 | 6,044,646 | MEMS10 |
| PO9393 | 09/113,065 | MEMS11 |
| PP0875 | 09/113,078 | MEMS12 |
| PP0894 | 09/113,075, U.S. Pat. No. 6,382,769 | MEMS13 |

STATEMENT REGARDING FEDERALLY SPONSORED RESEARCH OR DEVELOPMENT

Not applicable.

FIELD OF THE INVENTION

The present invention relates to the manufacture of ink jet printhead and, in particular, discloses a method of manufacturing of a thermally actuated Ink Jet Printer.

BACKGROUND OF THE INVENTION

Many ink jet printing mechanisms are known. Unfortunately, in mass production techniques, the production of ink jet printheads is quite difficult. For example, often, the orifice or nozzle plate is constructed separately from the ink supply and ink ejection mechanism and bonded to the mechanism at a later stage (Hewlett-Packard Journal, Vol. 36 no 5, pp33–37 (1985)). These separate material processing steps required in handling such precision devices often add a substantial expense in manufacturing.

Additionally, side shooting ink jet technologies (U.S. Pat. No. 4,899,181) are often used but again, this limits the amount of mass production throughput given any particular capital investment.

Additionally, more esoteric techniques are also often utilised. These can include electroforming of nickel stage (Hewlett-Packard Journal, Vol. 36 no 5, pp33–37 (1985)), electro-discharge machining, laser ablation (U.S. Pat. No. 5,208,604), micro-punching, etc.

The utilisation of the above techniques is likely to add substantial expense to the mass production of ink jet printheads and therefore adds substantially to their final cost.

It would therefore be desirable if an efficient system for the mass production of ink jet printhead could be developed.

SUMMARY OF THE INVENTION

It is an object of the present invention to provide an alternative form of ink jet printing device suitable for use at high speeds and having a number of advantages over the prior art.

In accordance with a first aspect of the present invention, there is provided a method of manufacturing a thermally actuated ink jet printhead wherein an array of nozzles are formed on a substrate utilising planar monolithic deposition, lithographic and etching processes. Preferably, multiple ink jet printheads are formed simultaneously on a single planar substrate such as a silicon wafer.

The printheads can be formed utilising standard vlsi/ulsi processing and can include integrated drive electronics formed on the same substrate. The drive electronics preferably being of a CMOS type. In the final construction, ink can be ejected from the substrate substantially normal to the substrate.

In accordance with a further aspect of the present invention, there is provided a method of manufacturing an ink jet printhead, the method comprising the steps of: (a) providing a semiconductor wafer having an electrical circuitry layer and a buried epitaxial layer formed thereon; (b) etching ink chamber cavities in the wafer, the etching stopping substantially at the epitaxial layer; (c) depositing and etching a first sacrificial material layer including vias for electrical interconnection of the electrical circuitry layer with subsequent layers; (d) depositing a first expansion layer of material having a high coefficient of thermal expansion over the ink chamber cavities; (e) depositing and etching a conductive material layer on the first expansion layer so as to form a heater element conductively interconnected to the electrical circuitry layer; (f) depositing and etching a second expansion layer of material having a high coefficient of thermal expansion over the conductive material layer, the etching including etching a shutter over each nozzle cavity; (g) back etching the wafer to the epitaxial layer; (h) etching a plurality of nozzle apertures, one for each ink chamber cavity, in the epitaxial layer; and (o) etching away the sacrificial layers.

The epitaxial layer can be utilized as an etch stop in step (b) which can comprise a plasma etch of the wafer.

The steps are preferably also utilized to simultaneously separate the wafer into separate printheads.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF PREFERRED AND OTHER EMBODIMENTS

Figure 1:
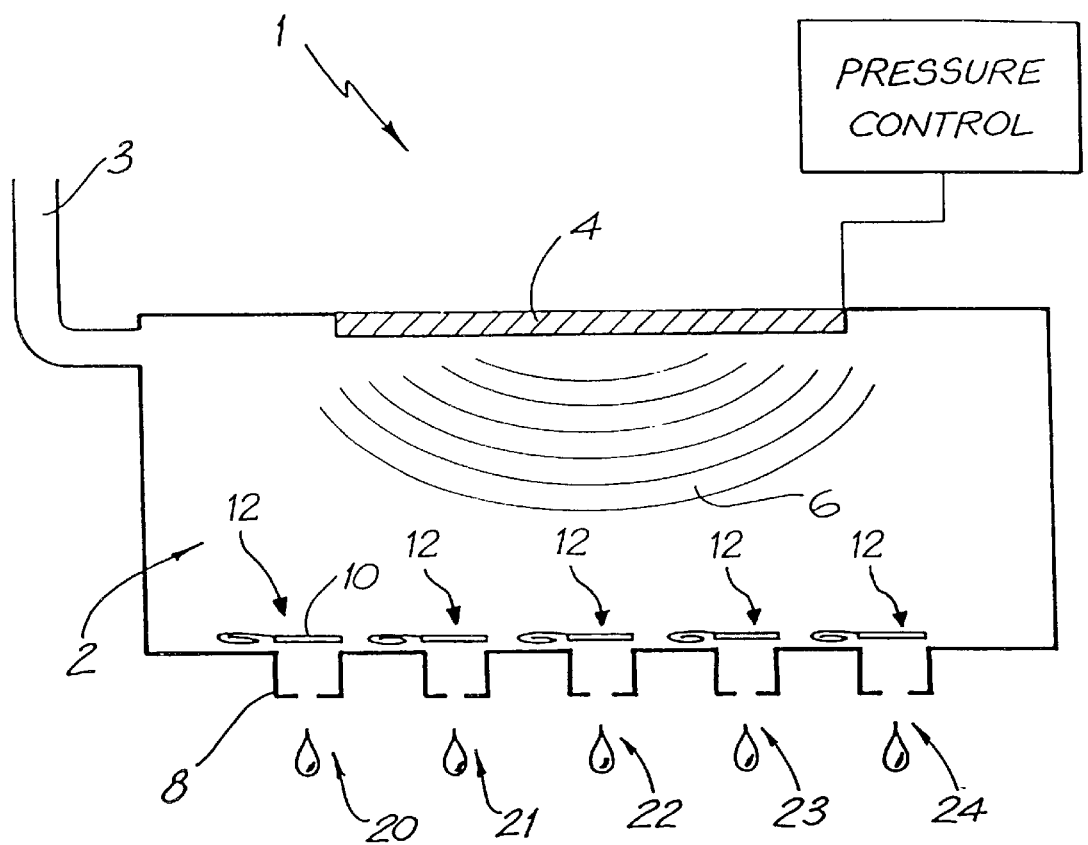
FIG. 1 is a schematic cross-sectional view illustrating an ink jet printhead constructed in accordance with the preferred embodiment.

Turning initially to FIG. 1, there is provided an ink reservoir 2 which is supplied by an ink supply conduit 3. An ultrasonic actuator 4 is driven in a substantially sine wave form so as to set up pressure waves 6 within the reservoir 2. The ultrasonic actuator 4 typically comprises a piezo electric transducer positioned within the reservoir 2. The transducer 4 oscillates the ink pressure within the reservoir 2 at approximately 100 KHz. The pressure is sufficient to eject the ink drops from each nozzle apparatus or nozzles 20 to 24 when required. Each nozzle 20 to 24 is provided with a shutter 10 which is opened and closed on demand.

Figure 2:
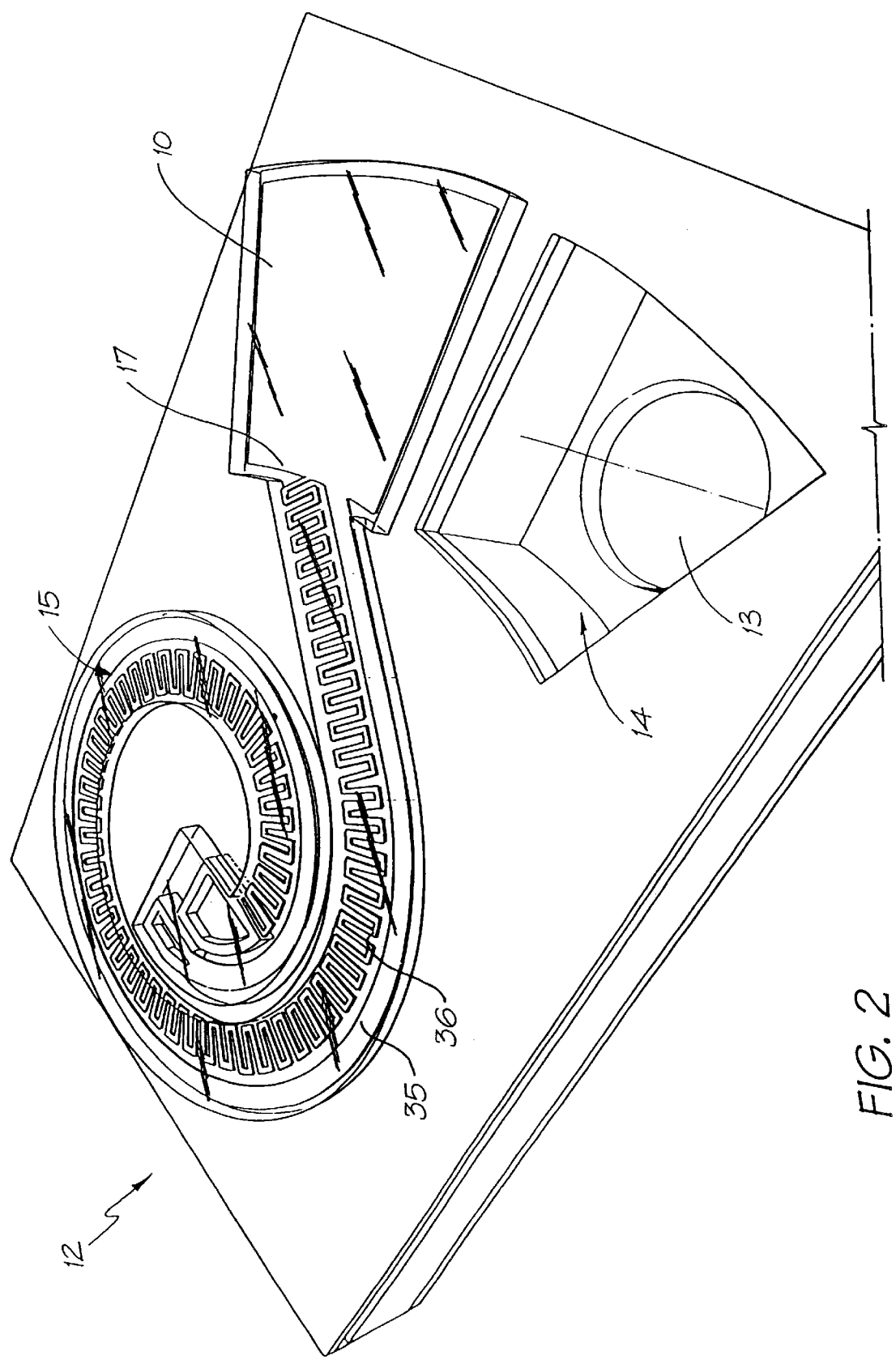
FIG. 2 is a perspective view of one single nozzle apparatus of the ink jet printhead constructed in accordance with a preferred embodiment of this invention.

In FIG. 2, there is illustrated a single nozzle 12 of FIG. 1.

Each nozzle 12 defines a nozzle hole 13 for the output of ink. An ink chamber 14 in fluid communication with the reservoir 2 is provided. The nozzle chamber 14 is normally filled with ink. Further, each nozzle 12 is provided with a shutter 10, which is designed to open and close the nozzle chamber 14 on demand. The shutter 10 is displaceable between a closed position in which the shutter is positioned intermediate the reservoir 2 and the chamber 14 and an open position in which unobstructed fluid communication between the reservoir 2 and the chamber 14 can occur. The shutter 10 is actuated by a coiled thermal actuator 15.

The coiled actuator 15 is constructed from laminated conductors of either differing resistivities, different cross-sectional areas, different indices of thermal expansion, different thermal conductivities to the ink, different lengths, or some combination thereof. The coiling radius of the actuator 15 changes when a current is passed through the conductors, as one side of the coiled beam expands to a different extent relative to the other. One method, as illustrated in FIG. 2, can be to utilise two current paths 35, 36, which are made of electrically conductive material. The current paths 35, 36 are connected at a shutter end 17 of the thermal actuator 15. One current path 36 is etched in a serpentine manner to increase an electrical resistance of the path 36. When a current is passed through paths 35, 36, the side of the coiled actuator 15 that comprises the serpentine path 36 expands more than the side that incorporates the path 35, as a result of the higher heat generated from the higher resistivity. This results in the actuator 15 uncoiling to a certain extent.

The thermal actuator 15 controls the position of the shutter 10 so that it can cover none, all or part of the nozzle chamber 14. If the shutter 10 does not cover any of the nozzle chamber 14, then the oscillating ink pressure is transmitted to the nozzle chamber 14 and the ink is ejected out of the nozzle hole 13. When the shutter 10 covers the ink chamber 14, then the oscillating ink pressure within the chamber 14 is significantly attenuated at the nozzle hole 13.

The shutter 10 can also be driven into a position intermediate the closed and open position, resulting in a partial attenuation of the ink pressure variation. This can be used to vary the volume of the ejected drop. This can also be used to implement a degree of continuation tone operation of the nozzle 12 or, to regulate the drop volume, or both. The shutter 10 is normally shut, and is opened on demand.

The operation of the ink jet nozzle 12 is now explained in further detail.

Figure 3:
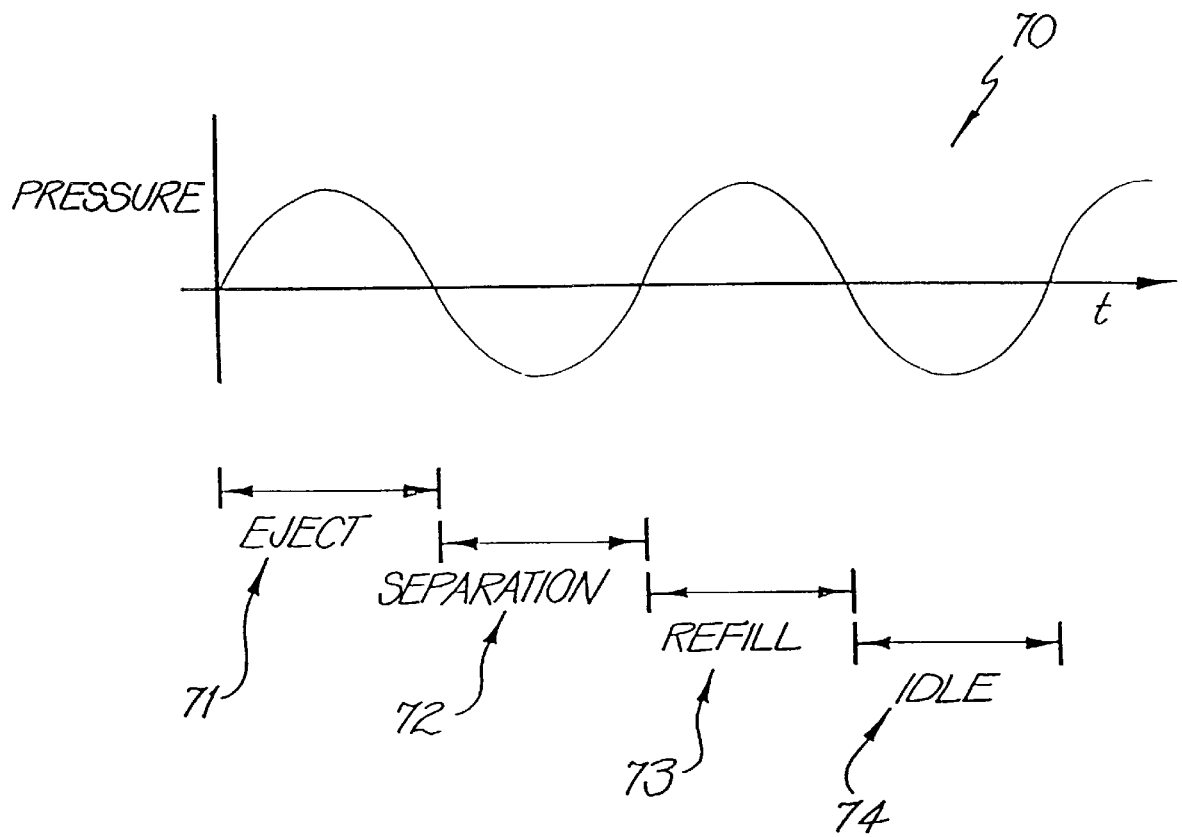
FIG. 3 is a timing diagram illustrating the various phases of operation of the nozzle apparatus of the ink jet printhead.

Referring to FIG. 3, the piezo electric transducer 4 is driven in a sinusoidal manner which in turn causes a sinusoidal variation 70 in the pressure within the ink reservoir 2 (FIG. 1) with respect to time.

The operation of the nozzle 12 occurs in four phases, being an ink ejection phase 71, an ink separation phase 72 an ink refill phase 73 and an idle ink nozzle phase 74.

Figure 4:
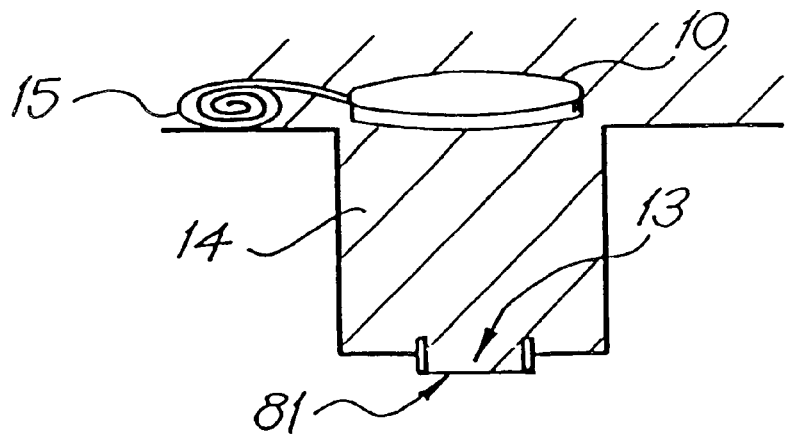
FIG. 4 is a cross-sectional schematic diagram illustrating the nozzle apparatus in an idle phase.

Referring now to FIG. 4, before the ink ejection phase 71 of FIG. 3, the shutter 10 is located over the ink chamber 14 and the ink forms a meniscus 81 over the nozzle hole 13.

Figure 5:
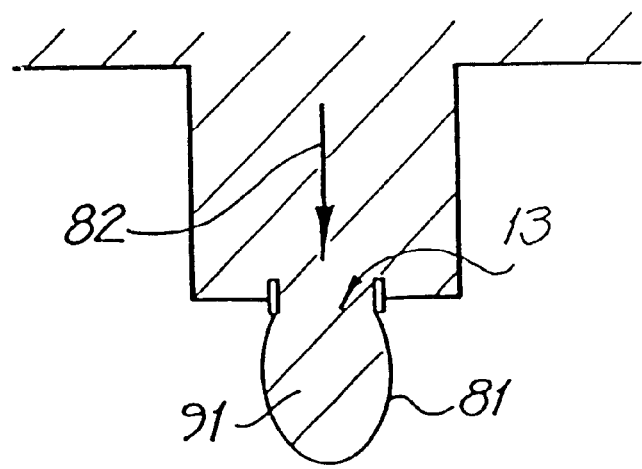
FIG. 5 is a cross-sectional schematic diagram illustrating the nozzle apparatus in an ejection phase.
Figure 6:
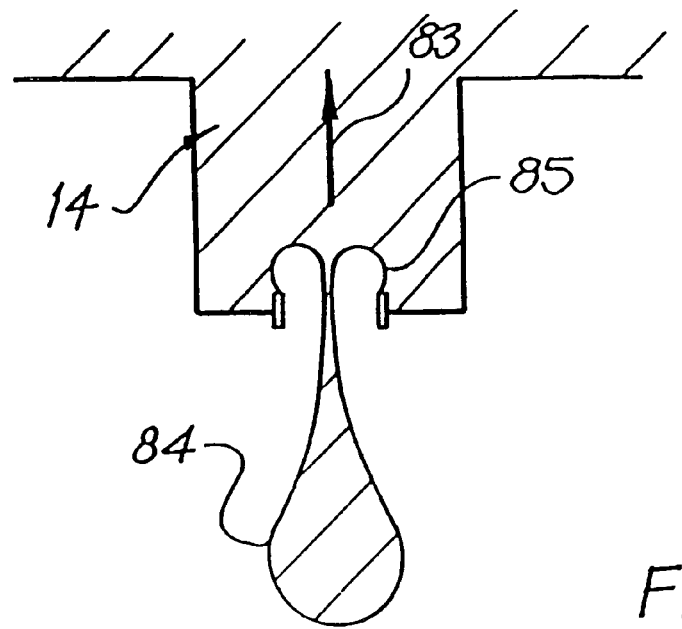
FIG. 6 is a cross-sectional schematic diagram illustrating the nozzle apparatus in a separation phase.

At the start of the ejection phase 71 the actuator coil is activated and the shutter 10 moves away from its position over the chamber 14 as illustrated in FIG. 5. As the chamber 14 is subjected to positive pressure, the meniscus 81 grows and the volume of ink 91 outside the nozzle hole 13 increases due to an ink flow 82. Subsequently, the separation phase 72 of FIG. 3 is entered. In this phase, the pressure within the chamber 14 is reduced to below ambient pressure. This causes a back flow 83 (FIG. 6) within the chamber 14 and results in the separation of a body of ink 84 from the nozzle hole 13. The below ambient pressure results in an ink flow 83 that drives the meniscus 85 into the ink chamber 14.

Figure 7:
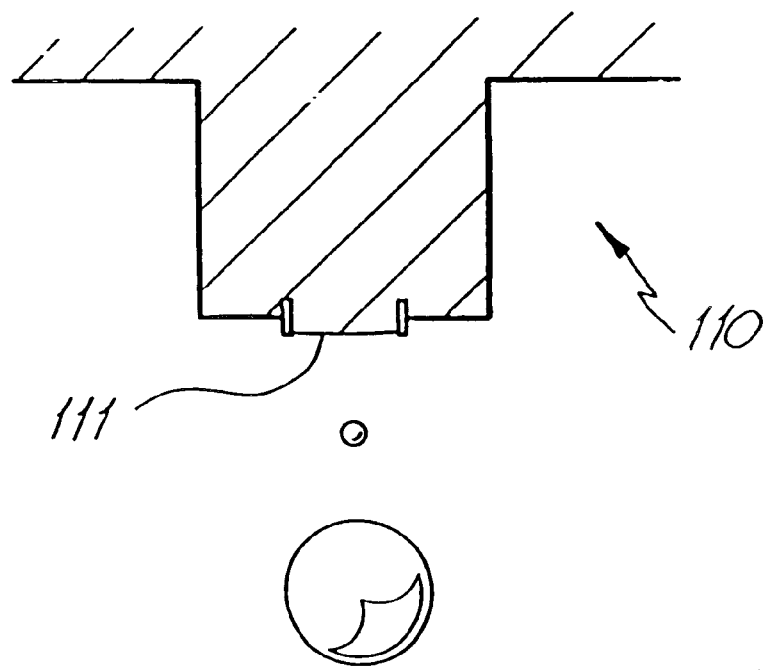
FIG. 7 is a cross-sectional schematic diagram illustrating the nozzle apparatus in a refilling phase.
Figure 8:
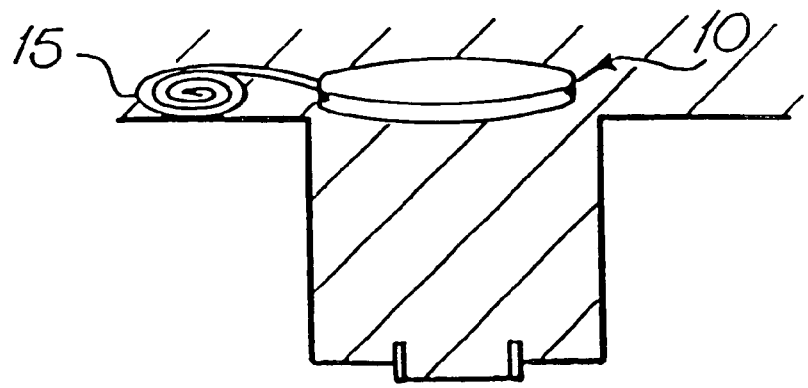
FIG. 8 is a cross-sectional schematic diagram illustrating the nozzle apparatus after returning to an idle phase.

Subsequently, the ink chamber 14 enters the refill phase 73 of FIG. 3 wherein positive pressure is again experienced. This results in a condition 110 as illustrated in FIG. 7 in which a meniscus position 111 is returned to that shown as 81 in FIG. 4. Subsequently, as illustrated in FIG. 8, the transducer 4 is deactivated and the shutter 10 returns to its original position ready for reactivation (idle phase 74 of FIG. 3).

The cycle operation as illustrated in FIG. 3 has a number of advantages. In particular, the level and duration of each sinusoidal cycle can be closely controlled by controlling the signal to the piezo electric transducer 4 (FIG. 1). Of course, a number of further variations are possible. For example, as each drop ejection takes two ink pressure cycles, half the nozzles, e.g., nozzles 20, 22 and 24 in FIG. 1 could be ejecting ink in one phase and the other half of the nozzles e.g., 21, 23 could be ejecting ink during a second phase. This allows for minimisation of the pressure variations which occur due to large numbers of nozzles being actuated simultaneously.

Further, the amplitude of the driving signal to the transducer 4 can be altered in response to the viscosity of the ink which will be typically effected by such factors as temperature and the number of drops which are to be ejected in the current cycle.

Construction and Fabrication

Each nozzle 12 further includes drive circuitry which activates the actuator 15 when the shutter is to move into the open position. The nozzle chamber 14 is dimensioned and a radius of the nozzle hole 13 is selected to control the drop velocity and drop size. Further, the ink chamber 14 of FIG. 2 is sufficiently wide so that viscous drag from the chamber walls does not significantly increase a force required by the actuator 4.

Preferably, the shutter 10 is in a disc form which covers the ink chamber 14. The shutter 10 preferably has a honeycomb like structure to maximise strength while minimising its mass and subsequent inertia.

Preferably, all surfaces are coated with a passivation layer to reduce the possibilities of corrosion from the ink flow. A suitable passivation layer can include silicon nitride ($Si_3N_4$), diamond like carbon (DLC), or other chemically inert, highly impermeable layer. The passivation layer is obviously especially important for device life, as the device will be immersed in ink.

Fabrication Sequence

Figure 9:
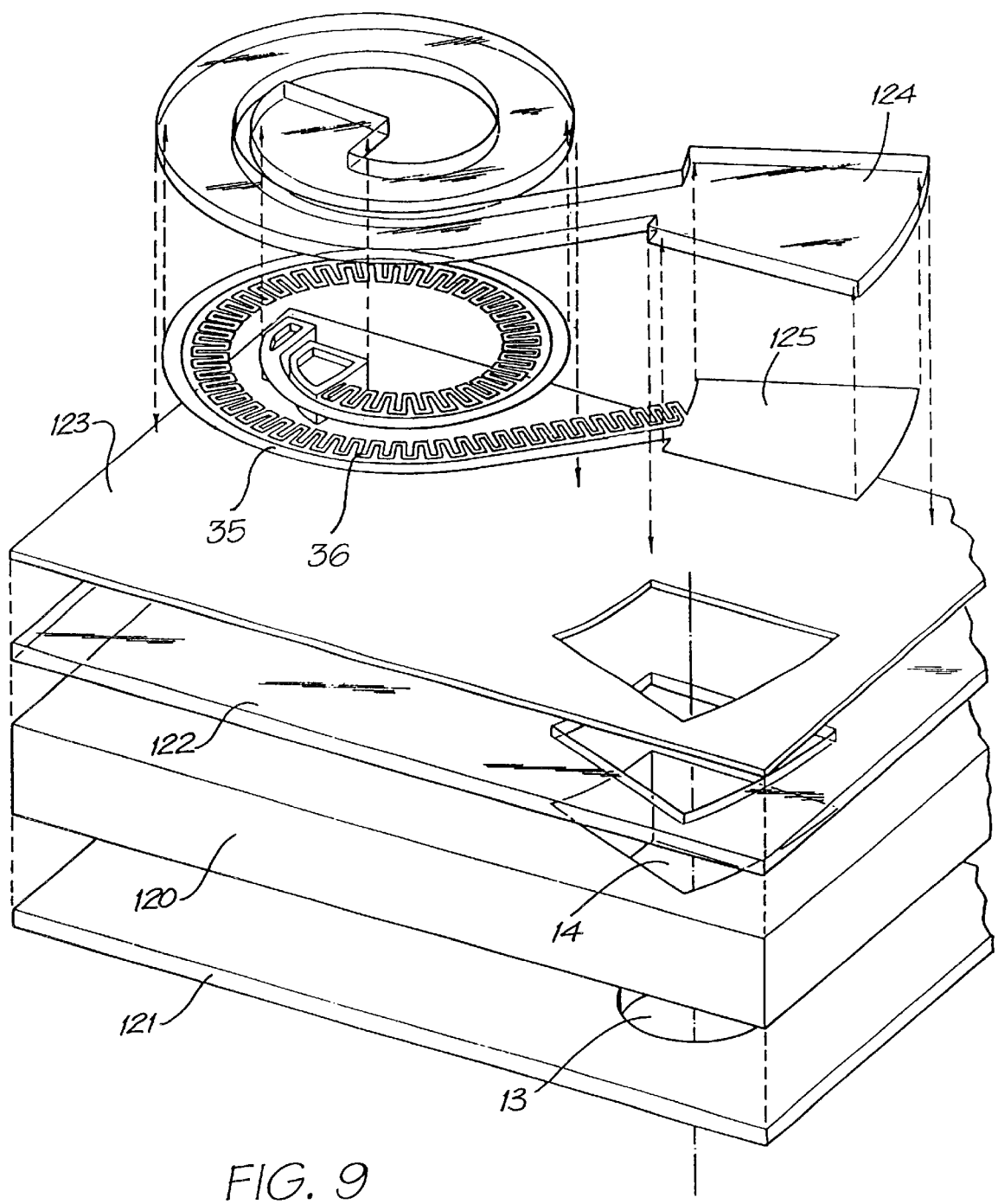
FIG. 9 is an exploded perspective view illustrating the construction of a single ink nozzle apparatus of FIG. 1.

FIG. 9 is an exploded perspective view illustrating the construction of a single ink jet nozzle in accordance with the preferred embodiment.

1) Start with a single crystal silicon wafer 120, and a buried epitaxial layer 121 of silicon which is heavily doped with boron. The boron is doped to preferably $10^{20}$ atoms per $cm^3$ of boron or more, and the layer 121 is approximately 2 $\mu$m thick. The silicon wafer 120 forms an epitaxial layer on top of the boron doped layer and is lightly doped with boron. The layer 120 is approximately 8 $\mu$m thick, and is doped in a manner suitable for the selected active semiconductor device technology. This is hereinafter called the "Sopij" wafer.

2) Fabricate the drive transistors and data distribution circuitry according to the process chosen in the CMOS layers 122, up until oxide over second level metal.

3) Planarise the wafer using Chemical Mechanical Planarisation (CMP).

Figure 12:
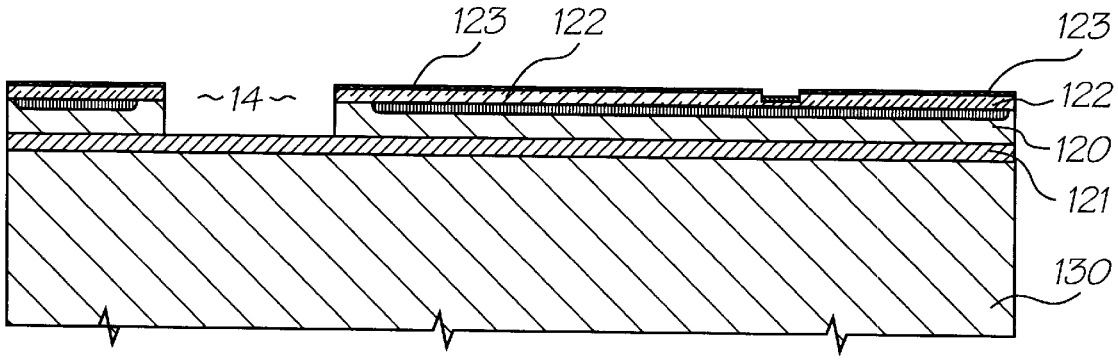

4) Plasma etch the ink chambers 14, stopping at the boron doped epitaxial silicon layer 121 (FIG. 12). This etch is through about 8 $\mu$m of silicon. The etch is highly anisotropic, with near vertical sidewalls. The etch stop detection can be the detection of boron in the exhaust gases. This step also etches the edge of the print head chips down to the boron layer 121, for later separation.

5) Conformably deposit a 0.2 μm layer 123 of high density Si$_3$N$_4$. This forms a corrosion barrier, so is substantially free of pinholes, and is substantially impermeable to OH ions.

Figure 14:
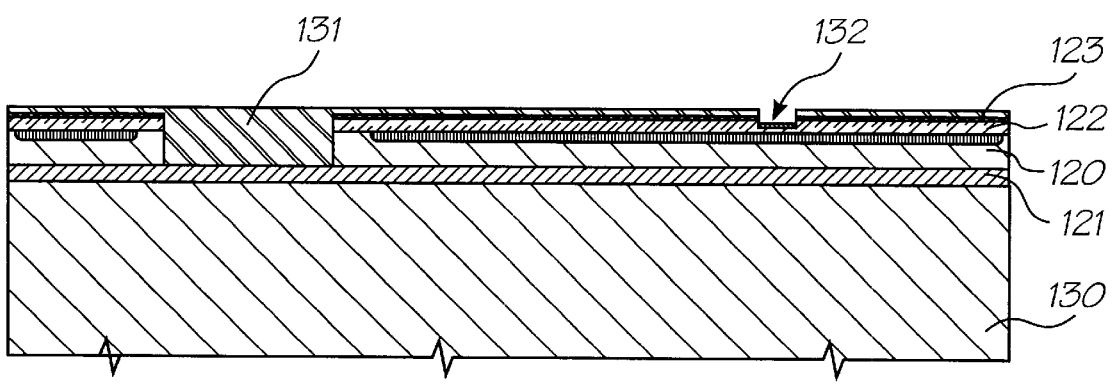

6) Deposit a thick sacrificial layer 131 on the layer 123 (FIG. 14). This layer 131 entirely fills the preformed ink chambers 14, and coats the entire wafer to an added thickness of 2 μm. The sacrificial layer may be SiO$_2$, for example, BPSG or spin on glass (SOG).

7) Mask and etch the sacrificial layer 131 using a coil post mask.

Figure 15:
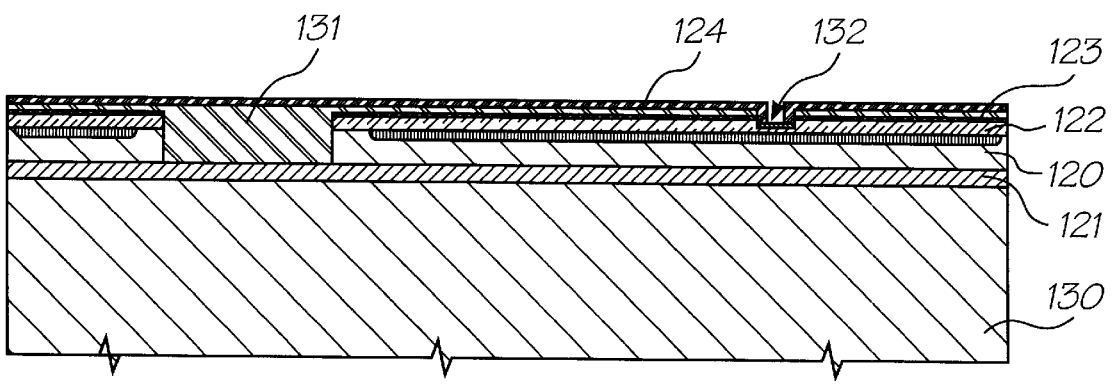

8) Deposit 0.2 mm of silicon nitride (Si$_3$N$_4$) on the layer 131 (FIG. 15)

9) Mask and etch the Si$_3$N$_4$ layer using a coil electric contacts mask, and a first layer 124 of PTFE using a coil mask.

10) Deposit 4 μm of nichrome alloy (NiCr).

Figure 17:
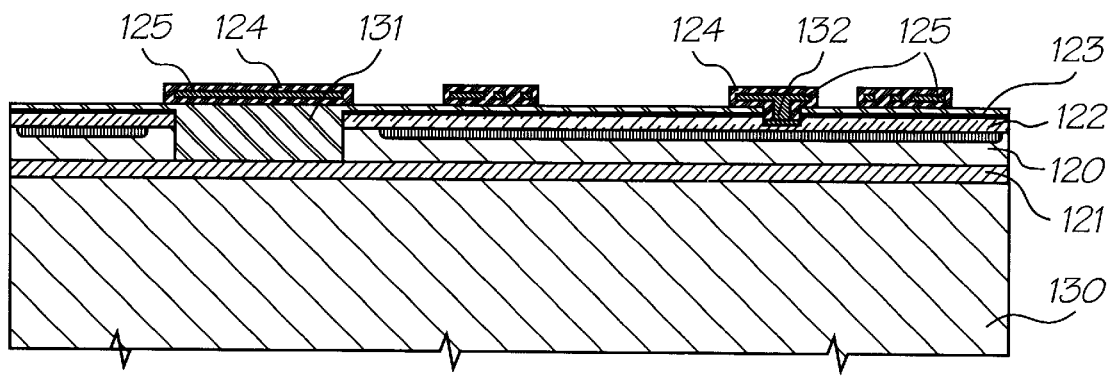

11) Deposit a copper conductive layer 125 and etch using a conductive layer mask FIG. 17).

12) Deposit a second layer of PTFE using a coil mask.

13) Deposit 0.2 μm layer of silicon nitride (Si$_3$N$_4$) (not shown).

14) Mask and etch the Si$_3$N$_4$, layer using a spring passivation and bond pad mask.

15) Permanently bond the Sopij wafer fabricated in steps 1 to 14 above onto a pre-fabricated ink channel wafer. The active side of the Sopij wafer faces the ink channel wafer.

16) Etch the Sopij wafer to entirely remove the backside silicon to the level of the boron doped epitaxial layer 121. This etch can be a batch wet etch in ethylene-diamine pyrocatechol (EPD).

Figure 20:
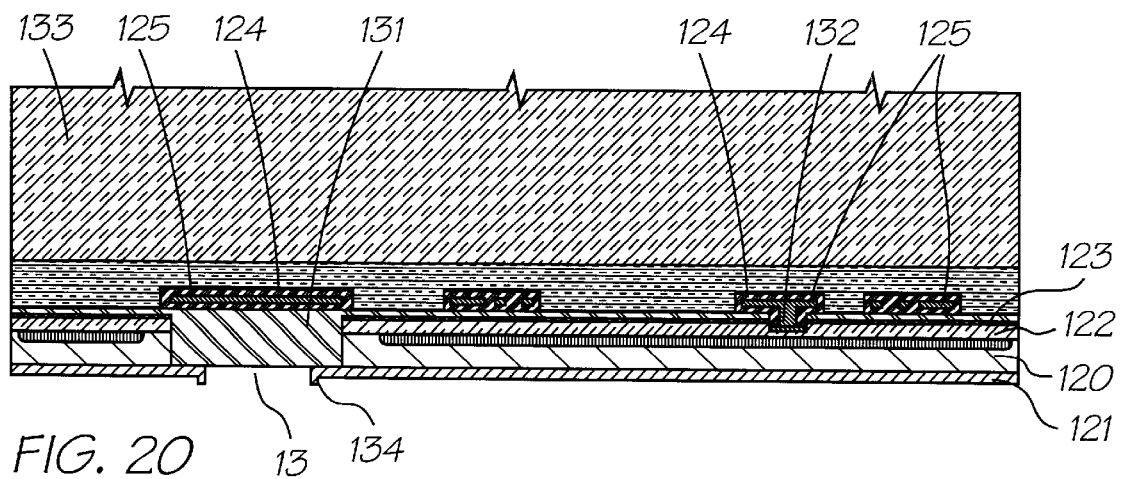

17) Mask the nozzle holes 13 from the underside of the Sopij wafer (FIG. 20). This mask also includes the chip edges.

18) Etch through the boron doped silicon layer 121. This etch is preferably deep into the sacrificial material 131 in the ink chambers 14 to reduce time required to remove the sacrificial material 131.

Figure 21:
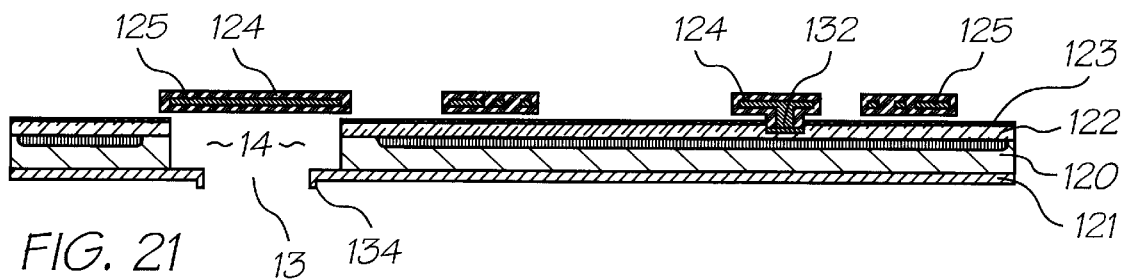

19) Completely etch the sacrificial material 131. If this material is SiO$_2$, then a HF etch can be used. Access of the HF to the sacrificial layer material 131 is through the nozzle 13, and simultaneously through the ink channel chip (FIG. 21).

20) Separate the chips from the backing plate. The two wafers have already been etched through, so the print heads do not need to be diced.

21) TAB bond the good chips.

22) Perform final testing on the TAB bonded print heads.

Figure 10:
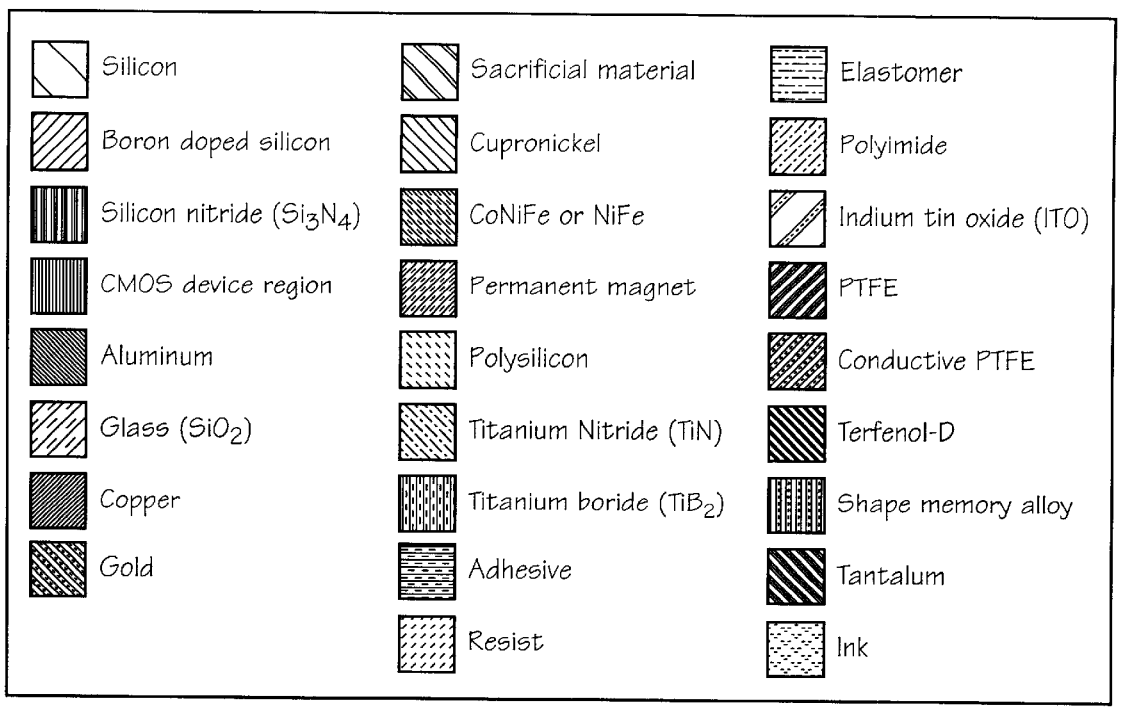
FIG. 10 provides a legend of the materials indicated in FIGS. 11 to 22.
Figure 11:
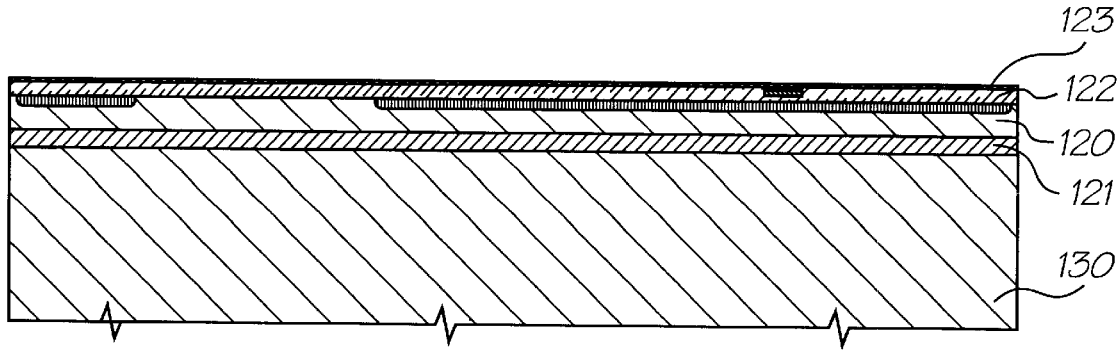
FIG. 11 to FIG. 22 illustrate sectional views of the manufacturing steps in one form of construction of the nozzle apparatus of FIG. 1.
Figure 13:
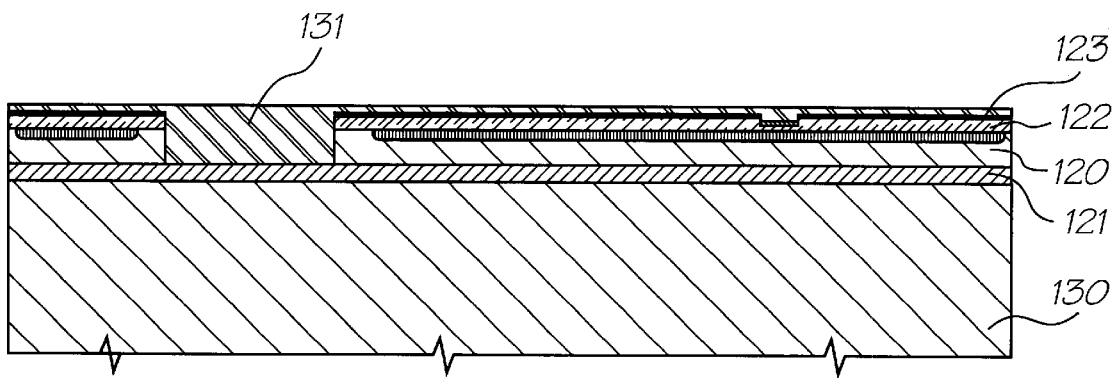
Figure 16:
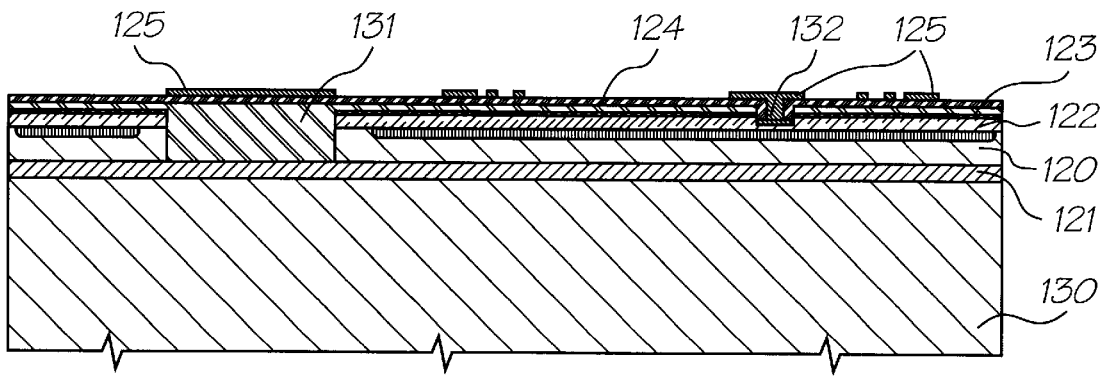
Figure 18:
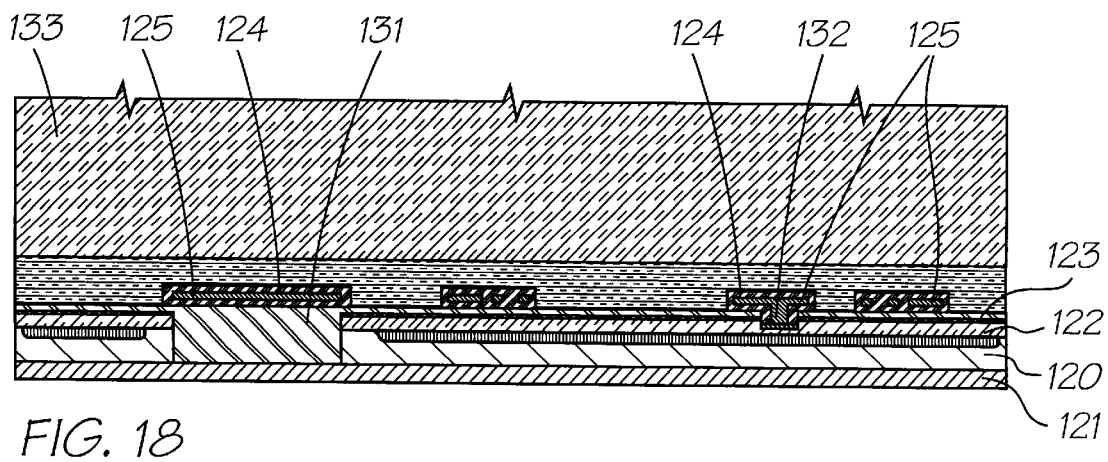
Figure 19:
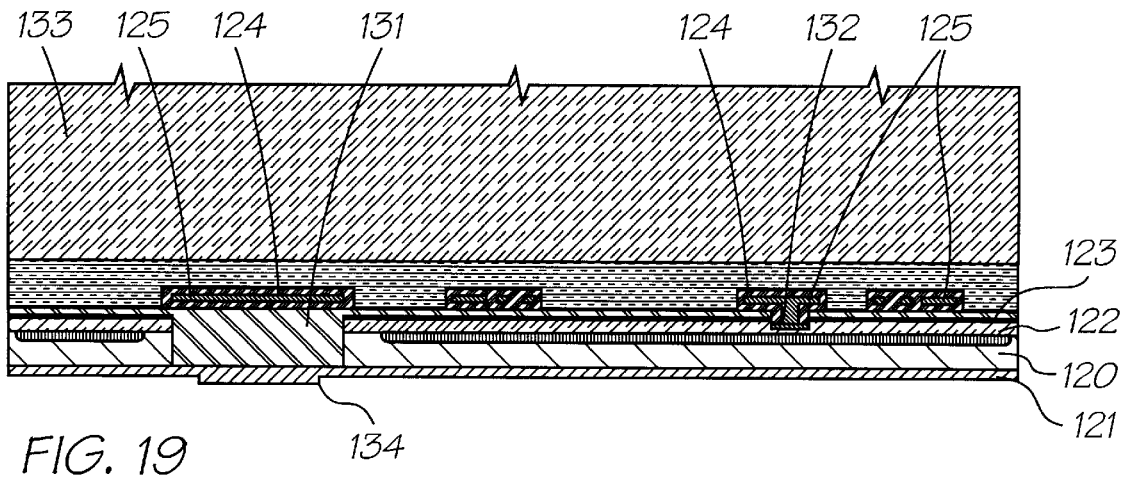
Figure 22:
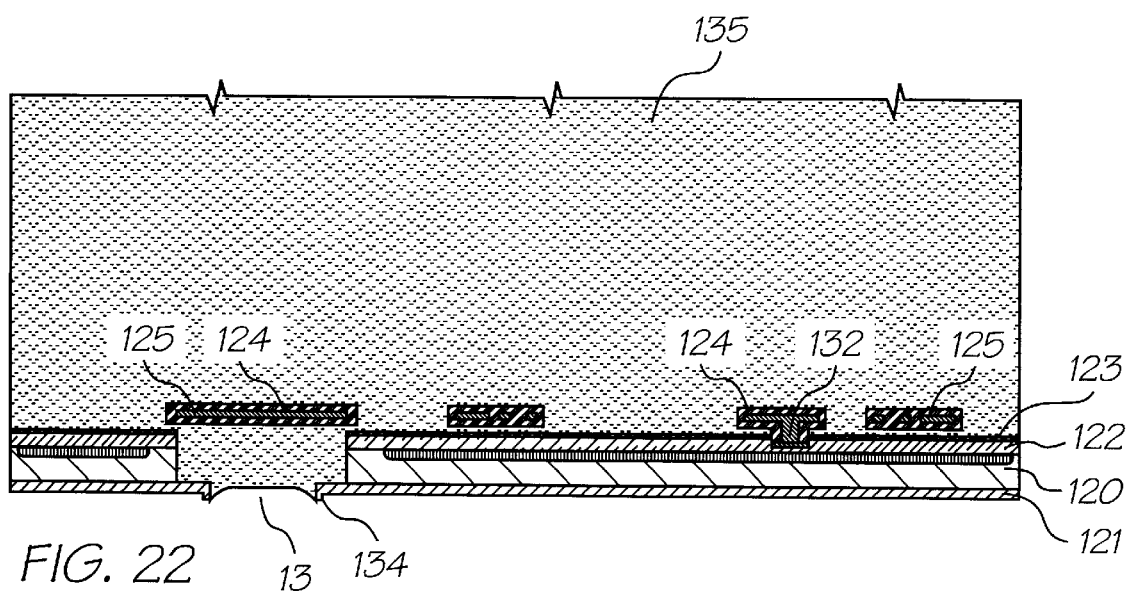

One alternative form of detailed manufacturing process which can be used to fabricate monolithic ink jet print heads carried out in accordance with the principles taught by the present embodiment can proceed utilizing the following steps:

1. Deposit 3 microns of epitaxial silicon 121 heavily doped with boron on a double sided polished wafer.
2. Deposit 10 microns of epitaxial silicon 120, either p-type or n-type, depending upon the CMOS process used.
3. Complete drive transistors, data distribution, and timing circuits using a 0.5 micron, one poly, 2 metal CMOS process. The wafer is passivated with 0.1 microns of silicon nitride 123. This step is shown in FIG. 11. For clarity, these diagrams may not be to scale, and may not represent a cross section though any single plane of the nozzle. FIG. 10 is a key to representations of various materials in these manufacturing diagrams, and those of other cross referenced ink jet configurations.
4. Etch the CMOS oxide layers down to silicon using Mask 1. This mask defines the ink chamber 14 below the shutter 10, and the edges of the print heads chips.
5. Plasma etch the silicon down to the boron doped buried layer 121, using oxide from step 4 as a mask. This step is shown in FIG. 12.
6. Deposit 6 microns of sacrificial material (e.g. aluminum or photosensitive polyimide) to form a sacrificial layer 131.
7. Planarize the sacrificial layer 131 to a thickness of 1 micron over the nitride 123. This step is shown in FIG. 13.
8. Etch the sacrificial layer 131 using Mask 2. This mask defines the actuator anchor point 132. This step is shown in FIG. 14.
9. Deposit 1 micron of PTFE.
10. Etch the PTFE, nitride, and oxide down to second level metal using Mask 3. This mask defines the heater vias. This step is shown in FIG. 15.
11. Deposit 1 micron of a conductor with a low Young's modulus, for example aluminum or gold.
12. Pattern the conductor using Mask 4. This step is shown in FIG. 16.
13. Deposit 1 micron of PTFE.
14. Etch the PTFE down to the sacrificial layer using Mask 5. This mask defines the actuator 15 and shutter 10. This step is shown in FIG. 17.
15. Wafer probe. All electrical connections are complete at this point, bond pads are accessible, and the chips are not yet separated.
16. Mount the wafer on a glass blank 133 and back-etch the wafer using KOH with no mask. This etch thins the wafer and stops at the buried boron doped silicon layer 121. This step is shown in FIG. 18.
17. Plasma back-etch the boron doped silicon layer 121 to a depth of (approx.) 1 micron using Mask 6. This mask defines the nozzle rim 134. This step is shown in FIG. 19.
18. Plasma back-etch through the boron doped layer using Mask 7. This mask defines the nozzle opening 13, and the edge of the chips. At this stage, the chips are separate, but are still mounted on the glass blank 133. This step is shown in FIG. 20.
19. Detach the chips from the glass blank 133 and etch the sacrificial material. The ink chambers 14 are cleared, the actuators freed, and the chips are separated by this etch. This step is shown in FIG. 21.
20. Mount the printheads in their packaging, which may be a molded plastic former incorporating ink channels which supply different colors of ink to the appropriate regions of the front surface of the wafer.
21. Connect the printheads to their interconnect systems.
22. Hydrophobize the front surface of the printheads.
23. Fill the completed printheads with ink and test them. A filled nozzle is shown in FIG. 22.

It would be appreciated by a person skilled in the art that numerous variations and/or modifications may be made to the present invention as shown in the specific embodiment without departing from the spirit or scope of the invention as broadly described. The present embodiment is, therefore, to be considered in all respects to be illustrative and not restrictive.

The presently disclosed ink jet printing technology is potentially suited to a wide range of printing systems including: color and monochrome office printers, short run digital printers, high speed digital printers, offset press supplemental printers, low cost scanning printers, high speed pagewidth printers, notebook computers with in-built pagewidth printers, portable color and monochrome printers, color and monochrome copiers, color and monochrome facsimile machines, combined printer, facsimile and copying machines, label printers, large format plotters, photograph copiers, printers for digital photographic 'minilabs', video printers, PHOTO CD (PHOTO CD is a registered trade mark of Eastman Kodak Company) printers, portable printers for PDAs, wallpaper printers, indoor sign printers, billboard printers, fabric printers, camera printers and fault tolerant commercial printer arrays.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewidth printheads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)

high resolution capability (1,600 dpi or more)

photographic quality output low manufacturing cost small size (pagewidth times minimum cross section)

high speed (<2 seconds per page).

All of these features can be met or exceeded by the ink jet systems described below with differing levels of difficulty. Forty-five different ink jet technologies have been developed by the Assignee to give a wide range of choices for high volume manufacture. These technologies form part of separate applications assigned to the present Assignee as set out in the list under the heading Cross References to Related Applications.

The ink jet designs shown here are suitable for a wide range of digital printing systems, from battery powered one-time use digital cameras, through to desktop and network printers, and through to commercial printing systems For ease of manufacture using standard process equipment, the printhead is designed to be a monolithic 0.5 micron CMOS chip with MEMS post processing. For color photographic applications, the printhead is 100 mm long, with a width which depends upon the ink jet type. The smallest printhead designed is covered in IJ38, which is 0.35 mm wide, giving a chip area of 35 square mm. The printheads each contain 19,200 nozzles plus data and control circuitry.

Ink is supplied to the back of the printhead by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The printhead is connected to the camera circuitry by tape automated bonding.

Tables of Drop-on-Demand Ink Jets

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)

Basic operation mode (7 types)

Auxiliary mechanism (8 types)

Actuator amplification or modification method (17 types)

Actuator motion (19 types)

Nozzle refill method (4 types)

Method of restricting back-flow through inlet (10 types)

Nozzle clearing method (9 types)

Nozzle plate construction (9 types)

Drop ejection direction (5 types)

Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. These are designated IH01 to IJ45, which match the docket numbers in the table under the heading Cross References to Related Applications.

Other ink jet configurations can readily be derived from these forty-five examples by substituting alternative configurations along one or more of the 11 axes. Most of the forty-five examples can be made into ink jet print heads with characteristics superior to any currently available ink jet technology.

Where there are prior art examples known to the inventor, one or more of these examples are listed in the examples column of the tables below. The IJ01 to IJ45 series are also listed in the examples column. In some cases, a print technology may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| ACTUATOR MECHANISM (APPLIED ONLY TO SELECTED INK DROPS) | | | | |
|---|---|---|---|---|
| | Description | Advantages | Disadvantages | Examples |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | Large force generated Simple construction No moving parts Fast operation Small chip area required for actuator | High power Ink carrier limited to water Low efficiency High temperatures required High mechanical stress Unusual materials required Large drive transistors Cavitation causes actuator failure Kogation reduces bubble formation Large print heads are difficult to fabricate | Canon Bubblejet 1979 Endo et al GB patent 2,007,162 Xerox heater-in-pit 1990 Hawkins et al U.S. Pat. No. 4,899,181 Hewlett-Packard TIJ 1982 Vaught et al U.S. Pat. No. 4,490,728 |
| Piezo-electric | A piezoelectric crystal such as lead lanthanum zirconate (PZT) is electrically activated, and either expands, shears, or bends to apply pressure to the ink, ejecting drops. | Low power consumption Many ink types can be used Fast operation High efficiency | Very large area required for actuator Difficult to integrate with electronics High voltage drive transistors required Full pagewidth print heads impractical due to actuator size Requires electrical poling in high field strengths during manufacture | Kyser et al U.S. Pat. No. 3,946,398 Zoltan U.S. Pat. No. 3,683,212 1973 Stemme U.S. Pat. No. 3,747,120 Epson Stylus Tektronix 09/112,803 |
| Electro-strictive | An electric field is used to activate electrostriction in relaxor materials such as lead lanthanum zirconate titanate (PLZT) or lead magnesium niobate (PMN). | Low power consumption Many ink types can be used Low thermal expansion Electric field strength required (approx. 3.5 V/$\mu$m) can be generated without difficulty Does not require electrical poling | Low maximum strain (approx. 0.01%) Large area required for actuator due to low strain Response speed is marginal (~10 $\mu$s) High voltage drive transistors required Full pagewidth print heads impractical due to actuator size | Seiko Epson, Usui et all JP 253401/96 09/112,803 |
| Ferro-electric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | Low power consumption Many ink types can be used Fast operation (<1 $\mu$s) Relatively high longitudinal strain High efficiency Electric field strength of around 3 V/$\mu$m can be readily provided | Difficult to integrate with electronics Unusual materials such as PLZSnT are required Actuators require a large area | 09/112,803 |
| Electro-static plates | Conductive plates are separated by a compressible or fluid dielectric (usualiy air). Upon application of a voltage, the plates attract each other and displace ink, causing drop ejection. The conductive plates may be in a comb or honeycomb structure, or stacked to increase the surface area and therefore the force. | Low power consumption Many ink types can be used Fast operation | Difficult to operate electrostatic devices in an aqueous environment The electrostatic actuator will normally need to be separated from the ink Very large area required to achieve high forces High voltage drive transistors may be required Full pagewidth print heads are not competitive due to actuator size | 09/112,787, 09/112,803 |
| Electro-static pull on ink | A strong electric field is applied to the ink, whereupon electrostatic attraction accelerates the | Low current consumption Low temperature | High voltage required May be damaged by sparks due to air breakdown Required field strength increases | 1989 Saito et al, U.S. Pat. No. 4,799,068 1989 Miura et al, U.S. Pat. No. 4,810,954 |

-continued

ACTUATOR MECHANISM
(APPLIED ONLY TO SELECTED INK DROPS)

| | Description | Advantages | Disadvantages | Examples |
|---|---|---|---|---|
| | ink towards the print medium. | | as the drop size decreases High voltage drive transistors required Electrostatic field attracts dust | Tone-jet |
| Permanent magnet electro-magnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc). | Low power consumption Many ink types can be used Fast operation High efficiency Easy extension from single nozzles to pagewidth print heads | Complex fabrication Permanent magnetic material such as Neodymium Iron Boron (NdFeB) required. High local currents required Copper metalization should be used for long electromigration lifetime and low resistivity Pigmented inks are usually infeasible Operating temperature limited to the Curie temperature (around 540K) | 09/113,084, 09/112,779 |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | Low power consumption Many ink types can be used Fast operation High efficiency Easy extension from single nozzles to pagewidth print heads | Complex fabrication Materials not usually present in a CMOS fab such as NiFe, CoNiFe, or CoFe are required High local currents required Copper metalization should be be used for long electromigration lifetime and low resistivity Electroplating is required High saturation flux density is required (2.0–2.1 T is achievable with CoNiFe [1]) | 09/112,751, 09/113,097, 09/113,066, 09/112,779, 09/113,061, 09/112,816, 09/112,772, 09/112,815 |
| Lorenz force | The Lorenz force acting on a current carrying wire in a magnetic field is utilized. This allows the magnetic field to be supplied externally to the print head, for example with rare earth permanent magnets. Only the current carrying wire need be fabricated on the print-head, simplifying materials requirements. | Low power consumption Many ink types can be used Fast operation High efficiency Easy extension from single nozzles to pagewidth print heads | Force acts as a twisting motion Typically, only a quarter of the solenoid length provides force in a useful direction High local currents required Copper metalization should be used for long electromigration lifetime and low resistivity Pigmented inks are usually infeasible | 09/113,099, 09/113,077, 09/112,818, 09/112,819 |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx 8 MPa. | Many ink types can be used Fast operation Easy extension from single nozzles to pagewidth print heads High force is available | Force acts as a twisting motion Unusual materials such as Terfenol-D are required High local currents required Copper metalization should be used for long electromigration lifetime and low resistivity Pre-stressing may be required | Fischenbeck, U.S. Pat. No. 4,032,929 09/113,121 |
| Surface tension reduction | Ink under positive pressure is held in a nozzle by surface tension. The surface tension of the ink is | Low power consumption Simple construction No unusual materials required in fabrication High efficiency | Requires supplementary force to effect drop separation Requires special ink surfactants Speed may be limited by surfactant properties | Silverbrook, EP 0771 658 A2 and related patent applications |

-continued

ACTUATOR MECHANISM
(APPLIED ONLY TO SELECTED INK DROPS)

| | Description | Advantages | Disadvantages | Examples |
|---|---|---|---|---|
| | reduced below the bubble threshold, causing the ink to egress from the nozzle. | Easy extension from single nozzles to pagewidth print heads | | |
| Viscosity reduction | The ink viscosity is locally reduced to select which drops are to be ejected. A viscosity reduction can be achieved electrothermally with most inks, but special inks can be engineered for a 100:1 viscosity reduction. | Simple construction No unusual materials required in fabrication Easy extension from single nozzles to pagewidth print heads | Requires supplementary force to effect drop separation Requires special ink viscosity properties High speed is difficult to achieve Requires oscillating ink pressure A high temperature difference (typically 80 degrees) is required | Silverbrook, EP 0771 658 A2 and related patent applications |
| Acoustic | An acoustic wave is generated and focussed upon the drop ejection region. | Can operate without a nozzle plate | Complex drive circuitry Complex fabrication Low efficiency Poor control of drop position Poor control of drop volume | 1993 Hadimioglu et al, EUP 550,192 1993 Elrod et al, EUP 572,220 |
| Thermo-elastic bend actuator | An actuator which relies upon differential thermal expansion upon Joule heating is used. | Low power consumption Many ink types can be used Simple planar fabrication Small chip area required for each actuator Fast operation High efficiency CMOS compatible voltages and currents Standard MEMS processes can be used Easy extension from single nozzles to pagewidth print heads | Efficient aqueous operation requires a thermal insulator on the the hot side Corrosion prevention can be difficult Pigmented inks may be infeasible, as pigment particles may jam the bend actuator | 09/112,802, 09/112,778, 09/112,815, 09/113,096, 09/113,068, 09/113,095, 09/112,808, 09/112,809, 09/112,780, 09/113,083, 09/112,793, 09/112,794, 09/113,128, 09/113,127, 09/112,756, 09/112,755, 09/112,754, 09/112,811, 09/112,812, 09/112,813, 09/112,814, 09/112,764, 09/112,765, 09/112,767, 09/112,768 |
| High CTE thermo-elastic actuator | A material with a very high coefficient of thermal expansion (CTE) such as polytetrafluoroethylene (PTFE) is used. As high CTE materials are usually non-conductive, a heater fabricated from a conductive material is incorporated. A 50 $\mu$m long PTFE bend actuator with polysilicon heater and 15 mW power input can provide 180 $\mu$N force and 10 $\mu$m deflection. Actuator motions include: Bend Push Buckle Rotate | High force can be generated Three methods of PTFE deposition are under development: chemical vapor deposition (CVD), spin coating, and evaporation PTFE is a candidate for low dielectric constant insulation in ULSI Very low power consumption Many ink types can be used Simple planar fabrication Small chip area required for each actuator Fast operation High efficiency CMOS compatible voltages and currents Easy extension from | Requires special material (e.g. PTFE) Requires a PFFE deposition process, which is not yet standard in ULSI fabs PTFE deposition cannot be followed with high temperature (above 350° C.) processing Pigmented inks may be infeasible, as pigment particles may jam the bend actuator | 09/112,778, 09/112,815, 09/113,096, 09/113,095, 09/112,808, 09/112,809, 09/112,780, 09/113,083, 09/112,793, 09/112,794, 09/113,128, 09/113,127, 09/112,756, 09/112,807, 09/112,806, 09/112,820 |

-continued

ACTUATOR MECHANISM
(APPLIED ONLY TO SELECTED INK DROPS)

| | Description | Advantages | Disadvantages | Examples |
|---|---|---|---|---|
| Conductive polymer thermo-elastic actuator | A polymer with a high coefficient of thermal expansion (such as PTFE) is doped with conducting substances to increase its conductivity to about 3 orders of magnitude below that of copper. The conducting polymer expands when resistively heated. Examples of conducting dopants include: Carbon nanotubes Metal fibers Conductive polymers such as doped polythiophene Carbon granules | single nozzles to pagewidth print heads High force can be generated Very low power consumption Many ink types can be used Simple planar fabrication Small chip area required for each actuator Fast operation High efficiency CMOS compatible voltages and currents Easy extension from single nozzles to pagewidth print heads | Requires special materials development (High CTE conductive polymer) Requires a PTFE deposition process, which is not yet standard in ULSI fabs PTFE deposition cannot be followed with high temperature (above 350° C.) processing Evaporation and CVD deposition techniques cannot be used Pigmented inks may be infeasible, as pigment particles may jam the bend actuator | 09/113,083 |
| Shape memory alloy | A shape memory alloy such as TiNi (also known as Nitinol - Nickel Titanium alloy developed at the Naval Ordnance Laboratory) is thermally switched between its weak martensitic state and its high stiffness austenic state. The shape of the actuator in its martensitic state is deformed relative to the austenic shape The shape change causes ejection of a drop. | High force is available (stresses of hundreds of MPa) Large strain is available (more than 3%) High corrosion resistance Simple construction Easy extension from single nozzles to pagewidth print heads Low voltage operation | Fatigue limits maximum number of cycles Low strain (1%) is required to extend fatigue resistance Cycle rate limited by heat removal Requires unusual materials (TiNi) The latent heat of transformation must be provided High current operation Requires pre-stressing to distort the martensitic state | 09/113,122 |
| Linear Magnetic Actuator | Linear magnetic actuators include the Linear Induction Acuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | Linear Magnetic actuators can be constructed with high thrust, long travel, and high efficiency using planar semiconductor fabrication techniques Long actuator travel is available Medium force is available Low voltage operation | Requires unusual semiconductor materials such as soft magnetic alloys (e.g. CoNiFe) Some varieties also require permanent magnetic materials such as as Neodymium iron boron (NdFeB) Requires complex multi-phase drive circuitry High current operation | 09/113,061 |

BASIC OPERATION MODE

| | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient velocity to overcome the surface tension. | Simple operation No external fields required Satellite drops can be avoided if drop velocity is less than 4 m/s Can be efficient, depending upon the actuator used | Drop repetition rate is usually limited to around 10 kHz. However, this is not fundamental to the method, but is related to the refill method normally used All of the drop kinetic energy must be provided by the actuator Satellite drops usually form if drop velocity is greater than 4.5 m/s | Thermal inkjet Piezoelectric ink jet 09/112,751, 09/112,787, 09/112,802, 09/112,803, 09/113,097, 09/113,099, 09/113,084, 09/112,778, |

-continued

BASIC OPERATION MODE

| | Description | Advantages | Disadvantages | Examples |
|---|---|---|---|---|
| | | | | 09/113,077, 09/113,061, 09/112,816, 09/112,819, 09/113,095, 09/112,809, 09/112,780, 09/113,083, 09/113,121, 09/113,122, 09/112,793, 09/112,794, 09/113,128, 09/113,127, 09/112,756, 09/112,755, 09/112,754, 09/112,811, 09/112,812, 09/112,813, 09/112,814, 09/112,764, 09/112,765, 09/112,767, 09/112,768, 09/112,807, 09/112,806, 09/112,820 |
| Proximity | The drops to be printed are selected by some manner (e.g. thermally induced surface tension reduction of pressurized ink). Selected drops are separated from the ink in the nozzle by contact with the print medium or a transfer roller. | Very simple print head fabrication can be used. The drop selection means does not need to provide the energy required to separate the drop from the nozzle | Requires close proximity between the print head and the print media or transfer roller May require two print heads printing alternate rows of the image Monolithic color print heads are difficult | Silverbrook, EP 0771 658 A2 and related patent applications |
| Electro-static pull on ink | The drops to be printed are selected by some manner (e.g. thermally induced surface tension reduction of pressurized ink). Selected drops are separated from the ink in the nozzle by a strong electric field. | Very simple print head fabrication can be used. The drop selection means does not need to provide the energy required to separate the drop from the nozzle | Requires very high electrostatic field Electrostatic field for small nozzle sizes is above air breakdown Electrostatic field may attract dust | Silverbrook, EP 0771 658 A2 and related patent applications Tone-Jet |
| Magnetic pull on ink | The drops to be printed are selected by some manner (e.g. thermally induced surface tension reduction of pressurized ink). Selected drops are separated from the ink in the nozzle by a strong magnetic field acting on the magnetic ink. | Very simple print head fabrication can be used. The drop selection means does not need to provide the energy required to separate the drop from the nozzle | Requires magnetic ink Ink colors other than black are difficult Requires very high magnetic fields | Silverbrook, EP 0771 658 A2 and related patent applications |
| Shutter | The actuator moves a shutter to block ink flow to the nozzle. The ink pressure is pulsed at a multiple of the drop ejection frequency. | High speed (>50 kHz) operation can be achieved due to reduced refill time Drop timing can be very accurate The actuator energy can be very low | Moving parts are required Requires ink pressure modulator Friction and wear must be considered Stiction is possible | 09/112,818, 09/112,815, 09/112,808 |
| Shuttered grill | The actuator moves a shutter to block ink | Actuators with small travel can be | Moving parts are required Requires ink pressure modulator | 09/113,066, 09/112,772, |

-continued

BASIC OPERATION MODE

| | Description | Advantages | Disadvantages | Examples |
|---|---|---|---|---|
| | flow through a grill to the nozzle. The shutter movement need only be equal to the width of the grill holes. | used Actuators with small force can be used High speed (>50(kHz) operation can be achieved | Friction and wear must be considered Stiction is possible | 09/113,096, 09/113,068 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | Extremely low energy operation is possible No heat dissipation problems | Requires an external pulsed magnetic field Requires special materials for both the actuator and the ink pusher Complex construction | 09/112,779 |

AUXILIARY MECHANISM
(APPLIED TO ALL NOZZLES)

| | Description | Advantages | Disadvantages | Examples |
|---|---|---|---|---|
| None | The actuator directly fires the ink drop, and there is no external field or other mechanism required. | Simplicity of construction Simplicity of operation Small physical size | Drop ejection energy must be supplied by individual nozzle actuator | Most ink jets, including piezoelectric and thermal bubble. 09/112,751, 09/112,787, 09/112,802, 09/112,803, 09/113,097, 09/113,084, 09/112,778, 09/113,077, 09/113,061, 09/112,816, 09/113,095, 09/112,809, 09/112,780, 09/113,083, 09/113,121, 09/113,122, 09/112,793, 09/112,794, 09/113,128, 09/113,127, 09/112,756, 09/112,755, 09/112,754, 09/112,811, 09/112,812, 09/112,813, 09/112,814, 09/112,764, 09/112,765, 09/112,767, 09/112,768, 09/112,807, 09/112,806, 09/112,820 |
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print | Oscillating ink pressure can provide a refill pulse, allowing higher operating speed The actuators may operate with much lower energy Acoustic lenses can be used to focus the sound on the nozzles | Requires external ink pressure oscillator Ink pressure phase and amplitude must be carefully controlled Acoustic reflections in the ink chamber must be designed for | Silverbrook, EP 0771 658 A2 and related patent applications 09/113,066, 09/112,818, 09/112,772, 09/112,815, 09/113,096, 09/113,068, 09/112,808 |

-continued

AUXILIARY MECHANISM (APPLIED TO ALL NOZZLES)

| | Description | Advantages | Disadvantages | Examples |
|---|---|---|---|---|
| | head, or preferably by an actuator in the ink supply. | | | |
| Media proximity | The print head is placed in close proximity to the print medium. Selected drops protrude from the print head further than unselected drops, and contact the print medium. The drop soaks into the medium fast enough to cause drop separation. | Low power High accuracy Simple print head construction | Precision assembly required Paper fibers may cause problems Cannot print on rough substrates | Silverbrook, EP 0771 658 A2 and related patent applications |
| Transfer roller | Drops are printed to a transfer roller instead of straight to the print medium. A transfer roller can also be used for proximity drop separation. | High accuracy Wide range of print substrates can be used Ink can be dried on the transfer roller | Bulky Expensive Complex construction | Silverbrook, EP 0771 658 A2 and related patent applications Tektronix hot melt piezoelectric ink jet Any of the forty-five series |
| Electro-static | An electric field is used to accelerate selected drops towards the print medium. | Low power Simple print head construction | Field strength required for separation of small drops is near or above air breakdown | Silverbrook, EP 0771 658 A2 and related patent applications Tone-Jet |
| Direct magnetic field | A magnetic field is used to accelerate selected drops of magnetic ink towards the print medium. | Low power Simple print head construction | Requires magnetic ink Requires strong magnetic field | Silverbrook,EP 0771 658 A2 and related patent applications |
| Cross magnetic field | The print head is placed in a constant magnetic field. The Lorenz force in a current carrying wire is used to move the actuator. | Does not require magnetic materials to be integrated in the print head manufacturing process | Requires external magnet Current densities may be high, resulting in electromigration problems | 09/113,099, 09/112,819 |
| Pulsed magnetic field | A pulsed magnetic field is used to cyclically attract a paddle, which pushes on the ink. A small actuator moves a catch, which selectively prevents the paddle from moving. | Very low power operation is possible Small print head size | Complex print head construction Magnetic materials required in print head | 09/112,779 |

ACTUATOR AMPLIFICATION OR MODIFICATION METHOD

| | Description | Advantages | Disadvantages | Examples |
|---|---|---|---|---|
| None | No actuator mechanical amplification is used The actuator directly drives the drop ejection process. | Operational simplicity | Many actuator mechanisms have insufficient travel, or insufficient force, to efficiently drive the drop ejection process | Thermal Bubble Ink jet 09/112,751, 09/112,787, 09/113,099, 09/113,084, 09/112,819, 09/113,121, 09/113,122 |
| Differential expansion bend actuator | An actuator material expands more on one side than on the other. The expansion may be thermal, piezoelectric, magnetostrictive, or other mechanism. The bend actuator converts a high force low travel actuator mechanism to | Provides greater travel in a reduced print head area | High stresses are involved Care must be taken that the materials do not delaminate Residual bend resulting from high temperature or high stress during formation | Piezoelectric 09/112,802, 09/112,778, 09/112,815, 09/113,096, 09/113,068, 09/113,095, 09/112,808, 09/112,809, 09/112,780, |

ACTUATOR AMPLIFICATION OR MODIFICATION METHOD

| | Description | Advantages | Disadvantages | Examples |
|---|---|---|---|---|
| | high travel, lower force mechanism. | | | 09/113,083, 09/112,793, 09/113,128, 09/113,127, 09/112,756, 09/112,755, 09/112,754, 09/112,811, 09/112,812, 09/112,813, 09/112,814, 09/112,764, 09/112,765, 09/112,807, 09/112,806, 09/112,820 |
| Transient bend actuator | A trilayer bend actuator where the two outside layers are identical. This cancels bend due to ambient temperature and residual stress. The actuator only responds to transient heating of one side or the other. | Very good temperature stability High speed, as a new drop can be fired before heat dissipates Cancels residual stress of formation | High stresses are involved Care must be taken that the materials do not delaminate | 09/112,767, 09/112,768 |
| Reverse spring | The actuator loads a spring. When the actuator is turned off, the spring releases. This can reverse the force/distance curve of the actuator to make it compatible with the force/time requirements of the drop ejection. | Better coupling to the ink | Fabrication complexity High stress in the spring | 09/113,097, 09/113,077 |
| Actuator stack | A series of thin actuators are stacked. This can be appropriate where actuators require high electric field strength, such as electrostatic and piezoelectric actuators. | Increased travel Reduced drive voltage | Increased fabrication complexity Increased possibility of short circuits due to pinholes | Some piezoelectric ink jets 09/112,803 |
| Multiple actuators | Multiple smaller actuators are used simultaneously to move the ink. Each actuator need provide only a portion of the force required. | Increases the force available from an actuator Multiple actuators can be positioned to control ink flow accurately | Actuator forces may not add linearly, reducing efficiency | 09/113,06#, 09/112,818, 09/113,096, 09/113,095, 09/112,809, 09/112,794, 09/112,807, 09/112,806 |
| Linear Spring | A linear spring is used to transform a motion with small travel and high force into a longer travel, lower force motion. | Matches low travel actuator with higher travel requirements Non-contact method of motion transformation | Requires print head area for the spring | 09/112,772 |
| Coiled actuator | A bend actuator is coiled to provide greater travel in a reduced chip area. | Increases travel Reduces chip area Planar implementations are relatively easy to fabricate. | Generally restricted to planar implementations due to extreme fabrication difficulty in other orientations. | 09/112,815, 09/112,808, 09/112,811, 09/112,812 |
| Flexure bend actuator | A bend actuator has a small region near the fixture point, which flexes much more readily than the remainder of the actuator. The actuator flexing is effectively converted from an even coiling to an angular bend, resulting in | Simple means of increasing travel of a bend actuator | Care must be taken not to exceed the elastic limit in the flexure area Stress distribution is very uneven Difficult to accurately model with finite element analysis | 09/112,779, 09/113,068, 09/112,754 |

-continued

ACTUATOR AMPLIFICATION OR MODIFICATION METHOD

| | Description | Advantages | Disadvantages | Examples |
|---|---|---|---|---|
| Catch | greater travel of the actuator tip. The actuator controls a small catch. The catch either enables or disables movement of an ink pusher that is controlled in a bulk manner. | Very low actuator energy Very small actuator size | Complex construction Requires external force Unsuitable for pigmented inks | 09/112,779 |
| Gears | Gears can be used to increase travel at the expense of duration. Circular gears, rack and pinion, ratchets, and other gearing methods can be used. | Low force, low travel actuators can be used Can be fabricated using standard surface MEMS processes | Moving parts are required Several actuator cycles are required More complex drive electronics Complex construction Friction, friction, and wear are possible | 09/112,818 |
| Buckle plate | A buckle plate can be used to change a slow actuator into a fast motion. It can also convert a high force, low travel actuator into a high travel, medium force motion. | Very fast movement achievable | Must stay within elastic limits of the materials for long device life High stresses involved Generally high power requirement | S. Hirata et al, "An Ink-jet Head Using Diaphragm Microactuator", Proc. IEEE MEMS, Feb. 1996, pp 418–423 09/113,096, 09/112,793 |
| Tapered magnetic pole | A tapered magnetic pole can increase travel at the expense of force. | Linearizes the magnetic force/distance curve | Complex construction | 09/112,816 |
| Lever | A lever and fulcrum is used to transform a motion with small travel and high force into a motion with longer travel and lower force. The lever can also reverse the direction of travel. | Matches low travel actuator with higher travel requirements Fulcrum area has no linear movement, and can be used for a fluid seal | High stress around the fulcrum | 09/112,755, 09/112,813, 09/112,814 |
| Rotary Impeller | The actuator is connected to a rotary impeller. A small angular deflection of the actuator results in a rotation of the impeller vanes, which push the ink against stationary vanes and out of the nozzle. | High mechanical advantage The ratio of force to travel of the actuator can be matched to the nozzle requirements by varying the number of impeller vanes | Complex construction Unsuitable for pigmented inks | 09/112,794 |
| Acoustic lens | A refractive or diffractive (e.g. zone plate) acoustic lens is used to concentrate sound waves. | No moving parts | Large area required Only relevant for acoustic ink jets | 1993 Hadimioglu et al, EUP 550,192 1993 Elrod et al, EUP 572,220 |
| Sharp conductive point | A sharp point is used to concentrate an electrostatic field. | Simple construction | Difficult to fabricate using standard VLSI processes for a surface ejecting ink-jet Only relevant for electrostatic ink jets | Tone-jet |

ACTUATOR MOTION

| | Description | Advantages | Disadvantages | Examples |
|---|---|---|---|---|
| Volume expansion | The volume of the actuator changes, pushing the ink in all directions. | Simple construction in the case of thermal ink jet | High energy is typically required to achieve volume expansion. This leads to thermal stress, cavitation, and kogation in thermal ink jet implementations | Hewlett-Packard Thermal Ink jet Canon Bubblejet |
| Linear, normal to chip surface | The actuator moves in a direction normal to the print head surface. | Efficient coupling to ink drops ejected normal to the | High fabrication complexity may be required to achieve perpendicular motion | 09/112,751, 09/112,787, 09/112,803, |

-continued

ACTUATOR MOTION

| | Description | Advantages | Disadvantages | Examples |
|---|---|---|---|---|
| | The nozzle is typically in the line of movement. | surface | | 09/113,084, 09/113,077, 09/112,816 |
| Parallel to chip surface | The actuator moves parallel to the print head surface. Drop ejection may still be normal to the surface. | Suitable for planar fabrication | Fabrication complexity Friction Stiction | 09/113,061, 09/112,818, 09/112,772, 09/112,754, 09/112,811, 09/112,812, 09/112,813 |
| Membrane push | An actuator with a high force but small area is used to push a stiff membrane that is in contact with the ink. | The effective area of the actuator becomes the membrane area | Fabrication complexity Actuator size Difficulty of integration in a VLSI process | 1982 Howkins U.S. Pat. No. 4,459,601 |
| Rotary | The actuator causes the rotation of some element, such a grill or impeller. | Rotary levers may be used to increase travel Small chip area requirements | Device complexity May have friction at a pivot point | 09/113,097, 09/113,066, 09/112,818, 09/112,794 |
| Bend | The actuator bends when energized. This may be due to differential thermal expansion, piezoelectric expansion, magnetostriction, or other form of relative dimensional change. | A very small change in dimensions can be converted to a large motion. | Requires the actuator to be made from at least two distinct layers, or to have a thermal difference across the actuator | 1970 Kyser et al U.S. Pat. No. 3,946,398 1973 Stemme U.S. Pat. No. 3,747,120 09/112,802, 09/112,778, 09/112,779, 09/113,068, 09/112,780, 09/113,083, 09/113,121, 09/113,128, 09/113,127, 09/112,756, 09/112,754, 09/112,811, 09/112,812 |
| Swivel | The actuator swivels around a central pivot. This motion is suitable where there are opposite forces applied to opposite sides of the paddle, e.g. Lorenz force. | Allows operation where the net linear force on the paddle is zero Small chip area requirements | Inefficient coupling to the ink motion | 09/113,099 |
| Straighten | The actuator is nortnally bent, and straightens when energized. | Can be used with shape memory alloys where the austenic phase is planar | Requires careful balance of stresses to ensure that the quiescent bend is accurate | 09/113,122, 09/112,755 |
| Double bend | The actuator bends in one direction when one element is energized, and bends the other way when another element is energized. | One actuator can be used to power two nozzles. Reduced chip size. Not sensitive to ambient temperature | Difficult to make the drops ejected by both bend directions identical. A small efficiency loss compared to equivalent single bend actuators. | 09/112,813, 09/112,814, 09/112,764 |
| Shear | Energizing the actuator causes a shear motion in the actuator material. | Can increase the effective travel of piezoelectric actuators | Not readily applicable to other actuator mechanisms | 1985 Fishbeck U.S. Pat. No. 4,584,590 |
| Radial constriction | The actuator squeezes an ink reservoir, forcing ink from a constricted nozzle. | Relatively easy to fabricate single nozzles from glass tubing as macroscopic structures | High force required Inefficient Difficult to integrate with VLSI processes | 1970 Zoltan U.S. Pat. No. 3,683,212 |
| Coil/uncoil | A coiled actuator uncoils or coils more tightly. The motion of the free end of the actuator ejects the ink. | Easy to fabricate as a planar VLSI process Small area required, therefore low cost | Difficult to fabricate for non-planar devices Poor out-of-plane stiffness | 09/112,815, 09/112,808, 09/112,811, 09/112,812 |
| Bow | The actuator bows (or buckles) in the middle when energized. | Can increase the speed of travel Mechanically rigid | Maximum travel is constrained High force required | 09/112,819, 09/113,096, 09/112,793 |
| Push-Pull | Two actuators control a shutter. One actuator | The structure is pinned at both ends, | Not readily suitable for ink jets which directly push the ink | 09/113,096 |

-continued

ACTUATOR MOTION

| | Description | Advantages | Disadvantages | Examples |
|---|---|---|---|---|
| | pulls the shutter, and the other pushes it. | so has a high out-of-plane rigidity | | |
| Curl inwards | A set of actuators curl inwards to reduce the volume of ink that they enclose. | Good fluid flow to the region behind the actuator increases efficiency | Design complexity | 09/113,095, 09/112,807 |
| Curl outwards | A set of actuators curl outwards, pressurizing ink in a chamher surrounding the actuators, and expelling ink from a nozzle in the chamber. | Relatively simple construction | Relatively large chip area | 09/112,806 |
| Iris | Multiple vanes enclose a volume of ink. These simultaneously rotate, reducing the volume between the vanes. | High efficiency Small chip area | High fabrication complexity Not suitable for pigmented inks | 09/112,809 |
| Acoustic vibration | The actuator vibrates at a high frequency. | The actuator can be physically distant from the ink | Large area required for efficient operation at useful frequencies Acoustic coupling and crosstalk Complex drive circuitry Poor control of drop volume and position | 1993 Hadimioglu et al, EUP 550,192 1993 Elrod et al, EUP 572,220 |
| None | In various ink jet designs the actuator does not move. | No moving pans | Various other tradeoffs are required to eliminate moving parts | Silverbrook, EP 0771 658 A2 and related patent applications Tone-jet |

NOZZLE REFILL METHOD

| | Description | Advantages | Disadvantages | Examples |
|---|---|---|---|---|
| Surface tension | This is the normal way that inkjets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle. | Fabrication simplicity Operational simplicity | Low speed Surface tension force relatively small compared to actuator force Long refill time usually dominates the total repetition rate | Thermal ink jet Piezoelectric ink jet 09/112,751, 09/112,787, 09/112,802, 09/112,803, 09/113,097, 09/113,099, 09/113,084, 09/112,779, 09/113,077, 09/113,061, 09/112,818, 09/112,816, 09/112,819, 09/113,095, 09/112,809, 09/112,780, 09/113,083, 09/113,121, 09/113,122, 09/112,793, 09/112,794, 09/113,128, 09/113,127, 09/112,756, 09/112,755, 09/112,754, 09/112,811, 09/112,812, 09/112,813, 09/112,814, 09/112,764, 09/112,765, 09/112,767, 09/112,768, 09/112,807, 09/112,806, 09/112,820, |

-continued

NOZZLE REFILL METHOD

| | Description | Advantages | Disadvantages | Examples |
|---|---|---|---|---|
| Shuttered oscillating ink pressure | Ink to the nozzle chamber is provided at a pressure that oscillates at twice the drop ejection frequency. When a drop is to be ejected, the shutter is opened for 3 half cycles: drop ejection, actuator return, and refill. The shutter is then closed to prevent the nozzle chamber emptying during the next negative pressure cycle. | High speed Low actuator energy, as the actuator need only open or close the shutter, instead of ejecting the ink drop | Requires common ink pressure oscillator May not be suitable for pigmented inks | 09/112,821, 09/113,066, 09/112,818, 09/112,772, 09/112,815, 09/113,096, 09/113,068, 09/112,808 |
| Refill actuator | After the main actuator has ejected a drop a second (refill) actuator is energized. The refill actuator pushes ink into the nozzle chamber. The refill actuator returns slowly, to prevent its return from emptying the chamber again. | High speed, as the nozzle is actively refilled | Requires two independent actuators per nozzle | 09/112,778 |
| Positive ink pressure | The ink is held a slight positive pressure. After the ink drop is ejected, the nozzle chamber fills quickly as surface tension and ink pressure both operate to refill the nozzle. | High refill rate, therefore a high drop repetition rate is possible | Surface spill must be prevented Highly hydrophobic print head surfaces are required | Silverbrook, EP 0771 658 A2 and related patent applications Alternative for: , , 09/112,751, 09/112,787, 09/112,802, 09/112,803, 09/113,097, 09/113,099, 09/113,084, 09/112,779 09/113,077, 09/113,061, 09/112,818, 09/112,816, 09/112,819, 09/113,095, 09/112,809, 09/112,780, 09/113,083, 09/113,121, 09/113,122, 09/112,793, 09/112,794, 09/113,128, 09/113,127, 09/112,756, 09/112,755, 09/112,754, 09/112,811, 09/112,812, 09/112,813, 09/112,814, 09/112,764, 09/112,765, 09/112,767, 09/112,768, 09/112,807, 09/112,806, 09/112,820, 09/112,821, |

| METHOD OF RESTRICTING BACK-FLOW THROUGH INLET | | | | |
|---|---|---|---|---|
| | Description | Advantages | Disadvantages | Examples |
| Long inlet channel | The ink inlet channel to the nozzle chamber is made long and relatively narrow, relying on viscous drag to reduce inlet back-flow. | Design simplicity Operational simplicity Reduces crosstalk | Restricts refill rate May result in a relatively large chip area Only partially effective Requires a method (such as a nozzle rim or effective hydrophobizing, or both) to prevent flooding of the ejection surface of the print head. | Thermal ink jet Piezoelectric ink jet 09/112,807, 09/112,806 Silverbrook, EP 0771 658 A2 and related patent applications |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | Drop selection and separation forces can be reduced Fast refill time | | Possible operation of the following: 09/112,751, 09/112,787, 09/112,802, 09/112,803, 09/113,097, 09/113,099, 09/113,084, 09/112,778, 09/112,779, 09/113,077, 09/113,061, 09/112,816, 09/112,819, 09/113,095, 09/112,809, 09/112,780 09/113,083, 09/113,121, 09/113,122, 09/112,793, 09/112,794, 09/113,128, 09/113,127, 09/112,756, 09/112,755, 09/112,754, 09/112,811, 09/112,813, 09/112,814, 09/112,764, 09/112,765, 09/112,767, 09/112,768, 09/112,820 |
| Baffle | One or more baffles are placed in the inlet ink flow. When the actuator is energized, the rapid ink movement creates eddies which restrict the flow through the inlet. The slower refill process is unrestricted, and does not result in eddies. | The refill rate is not as restricted as the long inlet method. Reduces crosstalk | Design complexity May increase fabrication complexity (e.g. Tektronix hot melt Piezoelectric print heads). | HP Thermal Ink Jet Tektronix piezoelectric ink jet |
| Flexible flap restricts inlet | In this method recently disclosed by Canon, the expanding actuator (bubble) pushes on a flexible flap that restricts the inlet. | Significantly reduces back-flow for edge-shooter thermal ink jet devices | Not applicable to most ink jet configurations Increased fabrication complexity Inelastic deformation of polymer flap results in creep over extended use | Canon |
| Inlet filter | A filter is located between the ink inlet and the nozzle chamber. The filter has a multitude of small holes or slots, restricting ink flow. The filter also removes particles which may block the nozzle. | Additional advantage of ink filtration Ink filter may be fabricated with no additional process steps | Restricts refill rate May result in complex construction | 09/112,803, 09/113,061, 9/113,083, 09/112,793, 09/113,128, 09/113,127 |
| Small inlet compared to nozzle | The ink inlet channel to the nozzle chamber has a substantially smaller cross section than that of the nozzle, | Design simplicity | Restricts refill rate May result in a relatively large chip area Only partially effective | 09/112,787, 09/112,814, 09/112,820 |

METHOD OF RESTRICTING BACK-FLOW THROUGH INLET

| | Description | Advantages | Disadvantages | Examples |
|---|---|---|---|---|
| Inlet shutter | resulting in easier ink egress out of the nozzle than out of the inlet. A secondary actuator controls the position of a shutter, closing off the ink inlet when the main actuator is energized. | Increases speed of the ink-jet print head operation | Requires separate refill actuator and drive circuit | 09/112,778 |
| The Inlet is located behind the ink-pushing surface | The method avoids the problem of inlet back-flow by arranging the ink-pushing surface of the actuator between the inlet and the nozzle. | Back-flow problem is eliminated | Requires careful design to minimize the negative pressure behind the paddle | 09/112,751, 09/112,802, 09/113,097, 09/113,099, 09/113,084, 09/112,779, 09/113,077, 09/112,816, 09/112,819, 09/112,809, 09/112,780, 09/113,121, 09/112,794, 09/112,756, 09/112,755, 09/112,754, 09/112,811, 09/112,812, 09/112,813, 09/112,765, 09/112,767, 09/112,768 |
| Part of the actuator moves to shut off the inlet | The actuator and a wall of the ink chamber are arranged so that the motion of the actuator closes off the inlet. | Significant reductions in back-flow can be achieved Compact designs possible | Small increase in fabrication complexity | 09/113,084, 09/113,095, 09/113,122, 09/112,764 |
| Nozzle actuator does not result in ink back-flow | In some configurations of inkjet, there is no expansion or movement of an actuator which may cause ink back-flow through the inlet. | Ink back-flow problem is eliminated | None related to ink back-flow on actuation | Silverbrook, EP 0771 658 A2 and related patent applications Valve-jet Tone-jet |

NOZZLE CLEARING METHOD

| | Description | Advantages | Disadvantages | Examples |
|---|---|---|---|---|
| Normal nozzle firing | All of the nozzles are fired periodically, before the ink has a chance to dry. When not in use the nozzles are sealed (capped) against air. The nozzle firing is usually performed during a special clearing cycle, after first moving the print head to a cleaning station. | No added complexity on the print head | May not be sufficient to displace dried ink | Most ink jet systems 09/112,751, 09/112,787, 09/112,802, 09/112,803, 09/113,097, 09/113,099, 09/113,084, 09/112,778, 09/112,779, 09/113,077, 09/113,061, 09/112,816, 09/112,819, 09/113,095, 09/112,809, 09/112,780, 09/113,083, 09/113,121, 09/113,122, 09/112,793, |

-continued

NOZZLE CLEARING METHOD

| | Description | Advantages | Disadvantages | Examples |
|---|---|---|---|---|
| | | | | 09/112,794, 09/113,128, 09/113,127, 09/112,756, 09/112,755, 09/112,754, 09/112,811, 09/112,813, 09/112,814, 09/112,764, 09/112,765, 09/112,767, 09/112,768, 09/112,807, 09/112,806, 09/112,820, 09/112,821 |
| Extra power to ink heater | In systems which heat the ink, but do not boil it under normal situations, nozzle clearing can be achieved by over-powering the heater and boiling ink at the nozzle. | Can be highly effective if the heater is adjacent to the nozzle | Requires higher drive voltage for clearing May require larger drive transistors | Silverbrook, EP 0771 658 A2 and related patent applications |
| Rapid succession of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | Does not require extra drive circuits on the print head Can be readily controlled and initiated by digital logic | Effectiveness depends substantially upon the configuration of the ink jet nozzle | May be used with: 09/112,751, 09/112,787, 09/112,802, 09/112,803, 09/113,097, 09/113,099, 09/113,084, 09/112,778, 09/112,779, 09/113,077, 09/112,816, 09/112,819, 09/113,095, 09/112,809, 09/112,780, 09/113,083, 09/113,121, 09/112,793, 09/112,794, 09/113,128, 09/113,127, 09/112,756, 09/112,755, 09/112,754, 09/112,811, 09/112,813, 09/112,814, 09/112,764, 09/112,765, 09/112,767, 09/112,768, 09/112,807, 09/112,806, 09/112,820, 09/112,821 |
| Extra power to ink pushing actuator | Where an actuator is not normally driven to the limit of its motion, nozzle clearing may be assisted by providing an enhanced drive signal to the actuator. | A simple solution where applicable | Not suitable where there is a hard limit to actuator movement | May be used with: 09/112,802, 09/112,778, 09/112,819, 09/113,095, 09/112,780, 09/113,083, 09/113,121, 09/112,793, 09/113,128, 09/113,127, |

-continued

NOZZLE CLEARING METHOD

| | Description | Advantages | Disadvantages | Examples |
|---|---|---|---|---|
| | | | | 09/112,756, 09/112,755, 09/112,765, 09/112,767, 09/112,768, 09/112,807, 09/112,806, 09/112,820, 09/112,821 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | A high nozzle clearing capability can be achieved May be implemented at very low cost in systems which already include acoustic actuators | High implementation cost if system does not already include an acoustic actuator | 09/113,066, 09/112,818, 09/112,772, 09/112,815, 09/113,096, 09/113,068, 09/112,808 |
| Nozzle clearing plate | A microfabricated plate is pushed against the nozzles. The plate has a post for every nozzle. A post moves through each nozzle, displacing dried ink. | Can clear severely clogged nozzles | Accurate mechanical alignment is required Moving parts are required There is risk of damage to the nozzles Accurate fabrication is required | Silverbrook, EP 0771 658 A2 and related patent applications |
| Ink pressure pulse | The pressure of the ink is temporarily increased so that ink streams from all of the nozzles. This may be used in conjunction with actuator energizing. | May be effective where other methods cannot be used | Requires pressure pump or other pressure actuator Expensive Wasteful of ink | May be used with all forty-five series ink jets |
| Print head wiper | A flexible 'blade' is wiped across the print head surface. The blade is usually fabricated from a flexible polymer, e.g. rubber or synthetic elastomer. | Effective for planar print head surfaces Low cost | Difficult to use if print head surface is non-planar or very fragile Requires mechanical parts Blade can wear out in high volume print systems | Many ink jet systems |
| Separate ink boiling heater | A separate heater is provided at the nozzle although the normal drop e-ection mechanism does not require it. The heaters do not require individual drive circuits, as many nozzles can be cleared simultaneously, and no imaging is required. | Can be effective where other nozzle clearing methods cannot be used Can be implemented at no additional cost in some ink jet configurations | Fabrication complexity | Can be used with many forty-five series ink jets |

| | NOZZLE PLATE CONSTRUCTION | | | |
|---|---|---|---|---|
| | Description | Advantages | Disadvantages | Examples |
| Electro-formed nickel | A nozzle plate is separately fabricated from electroformed nickel, and bonded to the print head chip. | Fabrication simplicity | High temperatures and pressures are required to bond nozzle plate Minimum thickness constraints Differential thermal expansion | Hewlett Packard Thermal Ink jet |
| Laser ablated or drilled polymer | Individual nozzle holes are ablated by an intense UV laser in a nozzle plate, which is typically a polymer such as polyimide or polysulphone | No masks required Can be quite fast Some control over nozzle profile is possible Equipment required is relatively low cost | Each hole must be individually formed Special equipment required Slow where there are many thousands of nozzles per print head May produce thin burrs at exit holes | Canon Bubblejet 1988 Sercel et al., SPIE, Vol. 998 Excimer Beam Applications, pp. 76–83 1993 Watanabe et al., U.S. Pat. No. 5,208,604 |
| Silicon micro-machined | A separate nozzle plate is micromachined from single crystal silicon, and bonded to the print head wafer. | High accuracy is attainable | Two part construction High cost Requires precision alignment Nozzles may be clogged by adhesive | K. Bean, IEEE Transactions on Electron Devices, Vol. ED-25, No. 10, 1978, pp 1185–1195 Xerox 1990 Hawkins et al., U.S. Pat. No. 4,899,181 |
| Glass capillaries | Fine glass capillaries are drawn from glass tubing. This method has been used for making individual nozzles, but is difficult to use for bulk manufacturing of print heads with thousands of nozzles. | No expensive equipment required Simple to make single nozzles | Very small nozzle sizes are difficult to form Not suited for mass production | 1970 Zoltan U.S. Pat. No. 3,683,212 |
| Monolithic, surface micro-machined using VLSI litho-graphic processes | The nozzle plate is deposited as a layer using standard VLSI deposition techniques. Nozzles are etched in the nozzle plate using VLSI lithography and etching. | High accuracy (<1 $\mu$m) Monolithic Low cost Existing processes can be used | Requires sacrificial layer under the nozzle plate to form the nozzle chamber Surface may be fragile to the touch | Silverbrook, EP 0771 658 A2 and related patent applications 09/112,751, 09/112,787, 09/112,803, 09/113,077, 09/113,061, 09/112,815, 09/113,096, 09/113,095, 09/112,809, 09/113,083, 09/112,793, 09/112,794, 09/113,128, 09/113,127, 09/112,756, 09/112,755, 09/112,754, 09/112,811, 09/112,813, 09/112,814, 09/112,764, 09/112,765, 09/112,767, 09/112,768, 09/112,807, 09/112,806, 09/112,820 |
| Monolithic, etched through substrate | The nozzle plate is a buried etch stop in the wafer. Nozzle chambers are etched in the front of the wafer, and the wafer is | High accuracy (<1 $\mu$m) Monolithic Low cost No differential expansion | Requires long etch times Requires a support wafer | 09/112,802, 09/113,097, 09/113,099, 09/113,084, 09/113,066, 09/112,778, |

-continued

NOZZLE PLATE CONSTRUCTION

| | Description | Advantages | Disadvantages | Examples |
|---|---|---|---|---|
| | thinned from the back side. Nozzles are then etched in the etch stop layer. | | | 09/112,779, 09/112,818, 09/112,816, 09/112,772, 09/112,819, 09/113,068, 09/112,808, 09/112,780, 09/113,121, 09/113,122 |
| No nozzle plate | Various methods have been tried to eliminate the nozzles entirely, to prevent nozzle clogging. These include thermal bubble mechanisms and acoustic lens mechanisms | No nozzles to become clogged | Difficult to control drop position accurately Crosstalk problems | Ricoh 1995 Sekiya et al U.S. Pat. No. 5,412,413 1993 Hadimioglu et al EUP 550,192 1993 Elrod et al EUP 572,220 |
| Trough | Each drop ejector has a trough through which a paddle moves. There is no nozzle plate. | Reduced manufacturing complexity Monolithic | Drop firing direction is sensitive to wicking. | 09/112,812 |
| Nozzle slit instead of individual nozzles | The elimination of nozzle holes and replacement by a slit encompassing many actuator positions reduces nozzle clogging, but increases crosstalk due to ink surface waves | No nozzles to become clogged | Difficult to control drop position accurately Crosstalk problems | 1989 Saito et al U.S. Pat. No. 4,799,068 |

DROP EJECTION DIRECTION

| | Description | Advantages | Disadvantages | Examples |
|---|---|---|---|---|
| Edge ('edge shooter') | Ink flow is along the surface of the chip, and ink drops are ejected from the chip edge. | Simple construction No silicon etching required Good heat sinking via substrate Mechanically strong Ease of chip handing | Nozzles limited to edge High resolution is difficult Fast color printing requires one print head per color | Canon Bubblejet 1979 Endo et al GB patent 2,007,162 Xerox heater-in-pit 1990 Hawkins et al U.S. Pat. No. 4,899,181 Tone-jet |
| Surface ('roof shooter') | Ink flow is along the surface of the chip, and ink drops are ejected from the chip surface, normal to the plane of the chip. | No bulk silicon etching required Silicon can make an effective heat sink Mechanical strength | Maximum ink flow is severely restricted | Hewlett-Packard TIJ 1982 Vaught et al U.S. Pat. No. 4,490,728 09/112,787, 09/113,077, 09/113,061, 09/113,095, 09/112,809 |
| Through chip, forward ('up shooter') | Ink flow is through the chip, and ink drops are ejected from the front surface of the chip. | High ink flow Suitable for pagewidth print heads High nozzle packing density therefore low manufacturing cost | Requires bulk silicon etching | Silverbrook, EP 0771 658 A2 and related patent applications 09/112,803, 09/112,815, 09/113,096, 09/113,083, 09/112,793, 09/112,794, 09/113,128, 09/113,127, 09/112,756, 09/112,755, |

-continued

DROP EJECTION DIRECTION

| | Description | Advantages | Disadvantages | Examples |
|---|---|---|---|---|
| Through chip, reverse ('down shooter') | Ink flow is through the chip, and ink drops are ejected from the rear surface of the chip. | High ink flow Suitable for pagewidth print heads High nozzle packing density therefore low manufacturing cost | Requires wafer thinning Requires special handling during manufacture | 09/112,754, 09/112,811, 09/112,812, 09/112,813, 09/112,814, 09/112,764, 09/112,765, 09/112,767, 09/112,768, 09/112,807, 09/112,806, 09/112,820, 09/112,821, 09/112,751, 09/112,802, 09/113,097, 09/113,099, 09/113,084, 09/113,066, 09/112,778, 09/112,779, 09/112,818, 09/112,816, 09/112,772, 09/112,819, 09/113,068, 09/112,808, 09/112,780, 09/113,121, 09/113,122 |
| Through actuator | Ink flow is through the actuator, which is not fabricated as part of the same substrate as the drive transistors. | Suitable for piezoelectric print heads | Pagewidth print heads require several thousand connections to drive circuits Cannot be manufactured in standard CMOS fabs Complex assembly required | Epson Stylus Tektronix hot melt piezoelectric ink jets |

INK TYPE

| | Description | Advantages | Disadvantages | Examples |
|---|---|---|---|---|
| Aqueous, dye | Water based ink which typically contains: water, dye, surfactant, humectant, and biocide. Modern ink dyes have high water-fastness, light fastness | Environmentally friendly No odor | Slow drying Corrosive Bleeds on paper May strikethrough Cockles paper | Most existing ink jets All forty-five series ink jets Silverbrook, EP 0771 658 A2 and related patent applications |
| Aqueous, pigment | Water based ink which typically contains: water, pigment, surfactant, humectant, and biocide. Pigments have an advantage in reduced bleed, wicking and strikethrough. | Environmentally friendly No odor Reduced bleed Reduced wicking Reduced strikethrough | Slow drying Corrosive Pigment may clog nozzles Pigment may clog actuator mechanisms Cockles paper | 09/112,787, 09/112,803, 09/112,808, 09/113,122, 09/112,793, 09/113,127 Silverbrook, EP 0771 658 A2 and related patent applications Piezoelectric ink-jets Thermal ink jets (with significant restrictions) |
| Methyl | MEK is a highly | Very fast drying | Odorous | All forty-five |

-continued

INK TYPE

| | Description | Advantages | Disadvantages | Examples |
|---|---|---|---|---|
| Ethyl Ketone (MEK) | volatile solvent used for industrial printing on difficult surfaces such as aluminum cans. | Prints on various substrates such as metals and plastics | Flammable | series ink jets |
| Alcohol (ethanol, 2-butanol, and others) | Alcohol based inks can be used where the printer must operate at temperatures below the freezing point of water. An example of this is in-camera consumer photographic printing. | Fast drying Operates at sub-freezing temperatures Reduced paper cockle Low cost | Slight odor Flammable | All forty-five series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | No drying time- ink instantly freezes on the print medium Almost any print medium can be used No paper cockle occurs No wicking occurs No bleed occurs No strikethrough occurs | High viscosity Printed ink typically has a 'waxy' feel Printed pages may 'block' Ink temperature may be above the curie point of permanent magnets Ink heaters consume power Long warm-up time | Tektronix hot melt piezoelectric ink jets 1989 Nowak U.S. Pat. No. 4,820,346 All forty-five series ink jets |
| Oil | Oil based inks are extensively used in offset printing. They have advantages in improved characteristics on paper (especially no wicking or cockle). Oil soluble dies and pigments are required. | High solubility medium for some dyes Does not cockle paper Does not wick through paper | High viscosity: this is a significant limitation for use in ink jets, which usually require a low viscosity. Some short chain and multi-branched oils have a sufficiently low viscosity. Slow drying | All forty-five series ink jets |
| Micro-emulsion | A microemulsion is a stable, self forming emulsion of oil, water, and surfactant. The characteristic drop size is less than 100 nm, and is determined by the preferred curvature of the surfactant. | Stops ink bleed High dye solubility Water, oil, and amphiphilic soluble dies can be used Can stabilize pigment suspensions | Viscosity higher than water Cost is slightly higher than water based ink High surfactant concentration required (around 5%) | All forty-five series ink jets |

I claim:

1. A method of manufacturing an ink jet printhead the method comprising the steps of:

(a) providing a semiconductor wafer having an electrical circuitry layer and a buried epitaxial layer formed thereon;

(b) etching a plurality of ink chamber cavities in the wafer, and stopping the etching at substantially the buried epitaxial layer;

(c) depositing a first sacrificial material layer on the wafer and etching the first sacrificial material layer to define vias for electrical interconnection of the electrical circuitry layer with subsequent layers;

(d) depositing a first expansion layer of material over the ink chamber cavities, the first expansion layer having a coefficient of thermal expansion that facilitates displacement of the first expansion layer when heat is applied to the layer;

(e) depositing a conductive material layer on the first expansion layer and etching the conductive material layer to form heater elements that are conductively interconnected to the electrical circuitry layer of the wafer;

(f) depositing a second expansion layer of material over the conductive material layer, the second expansion layer having a coefficient of thermal expansion that facilitates displacement of the second expansion layer when heat is applied to the layer, and etching the first and second expansion layers to define a plurality of thermal actuators, one for each ink chamber cavity, so that each thermal actuator comprises a heater element positioned between layers of the expansion material, and a plurality of shutters, one shutter positioned over each of the ink chamber cavities;

(g) back etching the wafer to the epitaxial layer; and (h) etching a plurality of nozzle apertures, one for each ink chamber cavity, in the epitaxial layer.

2. A method as claimed in claim 1 wherein the epitaxial layer is utilized as an etch stop when etching the ink chamber cavities.

3. A method as claimed in claim 1 wherein the ink chamber cavities are formed by plasma etching the wafer.

4. A method as claimed in claim 1 wherein the conductive material layer is formed with substantially pure gold.

5. A method as claimed in claim 1 further including the step of depositing corrosion barriers over portions of the wafer to reduce corrosion effects.

6. A method as claimed in claim 1 wherein the wafer comprises a double sided polished CMOS wafer.

7. A method as claimed in claim 1 which includes separating the wafer into printhead chips.

* * * * *